(12) United States Patent
Brenders et al.

(10) Patent No.: US 10,094,942 B2
(45) Date of Patent: Oct. 9, 2018

(54) SEISMIC ACQUISITION METHOD AND APPARATUS

(71) Applicant: BP Corporation North America Inc., Houston, TX (US)

(72) Inventors: Andrew James Brenders, Houston, TX (US); Joseph Anthony Dellinger, Houston, TX (US)

(73) Assignee: BP Corporation North America Inc., Houston, TX (US)

( * ) Notice: Subject to any disclaimer, the term of this patent is extended or adjusted under 35 U.S.C. 154(b) by 215 days.

(21) Appl. No.: 14/955,869

(22) Filed: Dec. 1, 2015

(65) Prior Publication Data

US 2016/0187504 A1 Jun. 30, 2016

Related U.S. Application Data

(60) Provisional application No. 62/086,362, filed on Dec. 2, 2014.

(51) Int. Cl.
*G01V 1/38* (2006.01)
*G01V 1/36* (2006.01)
(Continued)

(52) U.S. Cl.
CPC .............. *G01V 1/005* (2013.01); *G01V 1/282* (2013.01); *G01V 1/364* (2013.01); *G01V 1/368* (2013.01); *G01V 1/3808* (2013.01); *G01V 1/3852* (2013.01); *G06F 17/10* (2013.01); *G01V 1/38* (2013.01); *G01V 2210/324* (2013.01); *G01V 2210/614* (2013.01); *G01V 2210/6222* (2013.01); *G01V 2210/67* (2013.01); *G01V 2210/673* (2013.01); *G01V 2210/679* (2013.01)

(58) Field of Classification Search
CPC ...... G01V 1/282; G01V 1/368; G01V 1/3808; G01V 1/3852; G01V 1/364; G01V 1/005;
(Continued)

(56) References Cited

U.S. PATENT DOCUMENTS 4,319,347 A 3/1982 Savit
4,758,998 A 7/1988 Johnson et al.
(Continued)

FOREIGN PATENT DOCUMENTS

CN 103323876 9/2013
WO 2010149589 12/2010

OTHER PUBLICATIONS

PCT International Search Report dated Mar. 2, 2016.

*Primary Examiner* — Daniel L Murphy
(74) *Attorney, Agent, or Firm* — Robert Hsiao

(57) ABSTRACT

The presently disclosed seismic acquisition technique employs a receiver array and a processing methodology that are designed to attenuate the naturally occurring seismic background noise recorded along with the seismic data during the acquisition. The approach leverages the knowledge that naturally occurring seismic background noise moves with a slower phase velocity than the seismic signals used for imaging and inversion and, in some embodiments, may arrive from particular preferred directions. The disclosed technique comprises two steps: 1) determining from the naturally occurring seismic background noise in the preliminary seismic data a range of phase velocities and amplitudes that contain primarily noise and the degree to which that noise needs to be attenuated, and 2) designing an acquisition and processing method to attenuate that noise relative to the desired signal.

6 Claims, 13 Drawing Sheets

(51) Int. Cl.
*G01V 1/00* (2006.01)
*G01V 1/28* (2006.01)
*G06F 17/10* (2006.01)

(58) Field of Classification Search
CPC ............. G01V 1/38; G01V 2210/6222; G01V 2210/673; G01V 2210/679; G01V 2210/614; G01V 2210/324; G01V 2210/67; G06F 17/10
USPC .............................................. 367/15, 20, 49
See application file for complete search history.

(56) References Cited

U.S. PATENT DOCUMENTS

| | | | |
|---|---|---|---|
| 5,430,689 A | 7/1995 | Rigsby et al. | |
| 7,257,049 B1 | 8/2007 | Laws et al. | |
| 7,725,266 B2 | 5/2010 | Sirgue et al. | |
| 2003/0218937 A1 | 11/2003 | Berg et al. | |
| 2007/0195644 A1 | 8/2007 | Marples et al. | |
| 2009/0147621 A1 | 6/2009 | Hegna | |
| 2010/0002539 A1 | 1/2010 | Kragh et al. | |
| 2010/0232260 A1 | 9/2010 | Zowarka et al. | |
| 2012/0075955 A1 | 3/2012 | Dean | |
| 2012/0147699 A1 | 6/2012 | Dellinger et al. | |
| 2012/0155217 A1* | 6/2012 | Dellinger | G01V 1/005 367/38 |
| 2012/0314536 A1 | 12/2012 | Bagaini | |
| 2013/0013212 A1 | 1/2013 | Hatchell et al. | |
| 2013/0170317 A1 | 7/2013 | Stork | |
| 2013/0250733 A1 | 9/2013 | Phillips et al. | |
| 2013/0333974 A1 | 12/2013 | Coste et al. | |
| 2014/0081576 A1 | 3/2014 | Grenie et al. | |
| 2014/0336939 A1 | 11/2014 | Brune | |
| 2015/0120200 A1 | 4/2015 | Brenders et al. | |

* cited by examiner

SEISMIC ACQUISITION METHOD AND APPARATUS

CROSS-REFERENCE TO RELATED APPLICATIONS

This application claims benefit of U.S. provisional patent application Ser. No. 62/086,362 filed Dec. 2, 2014, and entitled "Box Wave Arrays in Marine Seismic Surveys," which is hereby incorporated herein by reference in its entirety.

STATEMENT REGARDING FEDERALLY SPONSORED RESEARCH OR DEVELOPMENT

Not applicable.

BACKGROUND

The presently disclosed invention pertains to seismic surveying and, more particularly, to a technique for low-frequency, seismic acquisition.

Seismic surveying is the practice of probing subterranean formations in the Earth using sound waves. This includes imparting acoustic, or sound, waves into a natural environment so that they enter the earth and travel through the subterranean geological formations of interest. During their travels through the formations, certain features of the formations will return waves back to the surface where they are recorded.

The recorded returning wave energy is then studied to ascertain information about those formations. The seismic data derived from the recorded waves are processed to, for example, image the subterranean formations of interest. Frequently, the images are used to model the subterranean formations. For example, models known as "subsurface attribute models" are frequently developed to study the subterranean formations. The images, and models derived from them, can help identify subsurface resources. Most notably, these resources may include fluid hydrocarbons such as petroleum and natural gas. The techniques may be applied to the location of other kinds of resources as well.

One type of seismic survey is the "marine" seismic survey. The term "marine" only indicates that the survey occurs in or on the water. It does not necessarily imply that the survey is occurring in a saltwater environment. While a marine seismic survey may occur in a saltwater environment such as the ocean, it may also occur in brackish waters such as are found in bays, estuaries, and tidal swamps. They may even be conducted in wholly fresh waters such as are found in lakes, marshes, and bogs.

Another relatively recent development in seismic acquisition is "low-frequency" acquisition. Seismic surveying historically has used frequencies in the range of 6-80 Hz for seismic signals because of their suitability in light of technical challenges inherent in seismic surveying. The term "low frequencies" is understood within this historical context as frequencies below which getting sufficient signal to noise with conventional sources rapidly becomes more difficult as the frequency decreases, i.e. below about 6-8 Hz.

The use of low frequencies for imaging with marine seismic data has proven challenging for frequencies below about 6 Hz, particularly for frequencies below about 4 Hz. The challenge is twofold: at lower frequencies the naturally occurring seismic background noise of the Earth gets progressively stronger, and conventional broadband sources such as airguns get progressively weaker. As a result, the signal-to-noise of deepwater marine seismic data can decline at over 30 dB per octave for frequencies below 4 Hz.

Thus, while there may be many suitable techniques for seismic imaging in general and for generating subsurface attribute models in particular, the need for increased effective signal-to-noise at low frequencies in the acquisition of seismic data continues to drive innovation in the art. In particular, among other things, there is a need for acquisition and processing techniques that enhance acquisition and use of low-frequency seismic data at lower frequencies. The art is therefore receptive to improvements or at least alternative means, methods and configurations that might further the efforts at improvement.

BRIEF DESCRIPTION OF THE DRAWINGS

The accompanying drawings, which are incorporated in and constitute a part of this specification, illustrate embodiments of the invention and together with the description, serve to explain the principles of the invention. In the figures.

DESCRIPTION OF THE EMBODIMENTS

Figure 1:
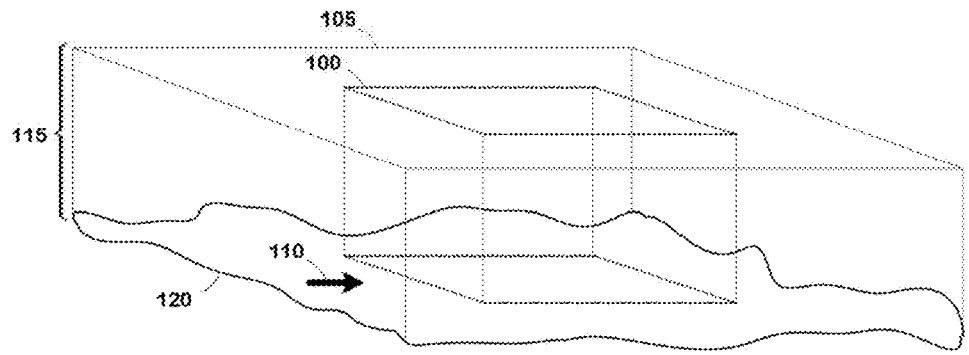
FIG. 1 depicts a seismic survey area within an area of interest in which a low-frequency seismic survey designed according to the technique disclosed herein may be conducted.

The presently disclosed marine seismic acquisition technique employs a receiver array and a processing methodology that are designed to attenuate the naturally occurring seismic background noise recorded along with the seismic data during the acquisition. The approach leverages the knowledge that naturally occurring seismic background noise moves with a slower phase velocity than the seismic signals used for imaging and inversion and, in some embodiments, may arrive from particular preferred directions. The disclosed technique comprises two steps: 1) determining from the naturally occurring seismic background noise in the preliminary seismic data a range of phase velocities and amplitudes that contain primarily noise and the degree to which that noise needs to be attenuated, and 2) designing an acquisition and processing method to attenuate that noise relative to the desired signal. Some embodiments of the disclosed technique also employ the arrival direction, or azimuth, of the noise because, where available, its use can sometimes prove advantageous.

What constitutes "primarily noise" and the degree of noise attenuation required will vary from embodiment to embodiment depending on implementation specific details. It is well known in the art that all seismic data contains noise and that the magnitude of this noise is measured by the "signal to noise" ratio, or the "S/N ratio". In general, the S/N ratio in any seismic data set must be high enough such that subsequent processing yields usable results for the purpose intended by the processing. Accordingly, the required S/N ratio and thus the required noise attenuation will vary depending on the processing employed and the use to which the processing results will be put. What constitutes "primarily noise" is therefore not readily amenable to objective quantification because of implementation specific variation. For present purposes, objectionable noise is that which is at an amplitude where it seriously degrades the ability to use the signal overlapping with it.

For example, one principal motivation for acquiring low frequencies is for the purpose of full-waveform inversion ("FWI"). FWI is an iterative optimization process that attempts to find an earth model that explains all of the seismic information recorded at the receivers. In an embodiment, FWI produces a three-dimensional volume giving an estimated subsurface attribute at each illuminated point within the earth. In embodiments, the subsurface attribute may include, but is not limited to, P-wave velocity, S-wave velocity, density, anisotropy parameters, elastic constants, attenuation parameters, or other subsurface wave velocities.

One popular FWI algorithm is frequency-domain FWI, in particular phase-only frequency-domain FWI, in which case only the phase of the data, and not its amplitude, are used for the inversion. To determine the impact of ambient noise on phase-only frequency-domain FWI, we first model seismic acquisition without noise, and calculate a phase for each source-receiver pair. We then add to the model results appropriately scaled measurements of ambient noise from the field, and again calculate a phase for each source-receiver pair. The difference between these indicates the phase error attributable to the ambient noise.

Modeling shows phase-only frequency-domain FWI results are not significantly degraded if the RMS phase errors introduced by the noise are less than about 20 degrees. We then must determine how much noise attenuation is required to reduce the RMS phase errors below this threshold. So, continuing this example, a modeled 1.5 Hz monochromatic signal lasting 1 minute processed against a background of measured noise produces a phase error of 2 degrees at a distance of 1 km, 10 degrees at 5 km, 20 degrees at 10 km, 41 degrees at 20 km, and 57 degrees at 30 km. Thus at 10 km the S/N (of about 2.5) is just adequate, but if we require offsets of 30 km then we must attenuate the noise relative to the signal at 1.5 Hz by about a factor of 30/10=3, or about 10 dB. Thus, in these particular embodiments with these particular parameters, data that are "primarily noise" are data whose S/N Those skilled in the art having the benefit of this disclosure will be able to perform similar calculations for other acquisition scenarios.

Receiver arrays to attenuate slow-moving noise are a conventional technique for land seismic surveys. Land receiver arrays typically contain a large number of elements. Such large arrays would be impractical for use with ocean-bottom node surveys. Consequently, conventional wisdom within the art is that such arrays are not useful and are not used in marine surveys.

Frequency-domain FWI requires data at only a small number of discrete frequencies to produce a useful result. Of this small number of discrete frequencies, typically only the lowest is sufficiently impacted by ambient noise to require a receiver array to suppress it. Thus, for an ocean-bottom node survey performed for the purposes of frequency-domain FWI, we have discovered that one can optimize the array design for that lowest frequency. In contrast to conventional broadband array design, this narrowband application allows dramatic reduction in the number of elements required, allowing recordation of usable data at lower frequencies than would otherwise be possible. The lower the usable frequency in the data, the larger the velocity anomaly that FWI can successfully resolve.

Although the method is described in terms of its particular applicability to data acquired for the purpose of processing with frequency-domain FWI, those of ordinary skill in the art will recognize that the techniques described herein are also amenable to other processing techniques, such as tomography or imaging via migration.

Reference will now be made in detail to the present embodiments (exemplary embodiments) of the invention, examples of which are illustrated in the accompanying drawings. Wherever possible, the same reference numbers will be used throughout the drawings to refer to the same or like parts.

Turning now to FIG. 1, the marine seismic survey is to be conducted in a survey area 100 located in an area of interest 105. The area 105 is of interest because of its potential for the production of a resource of interest—e.g., fluid hydrocarbons. The industry spends a great deal of effort locating, identifying, and acquiring rights to areas of interest such as the area of interest 105. The same is true for the selection of the survey area 100 within the area of interest 105. Accordingly, the means and methods by which this is done are well known in the art and so will not be further discussed so as not to obscure the invention.

The survey area 100, and the area of interest 105 in general, experience naturally occurring seismic background noise 110. Those in the art will appreciate that the naturally occurring seismic background noise 110 is typically more diffuse than one might infer from the graphic element used to represent it in FIG. 1. The naturally occurring seismic background noise 110 can be characterized by attributes such as phase velocity, amplitude, azimuth, etc., and generally will not vary greatly in those attributes within an area of interest 105, or will vary with position in a smooth and predictable manner.

Those in the art will also appreciate that the scale of both the survey area 100 and the area of interest 105 may vary greatly depending on the particular use. This is true in the sense of the relative sizes. The survey area 100 may in some embodiments be coterminous or nearly coterminous with the area of interest 105 while in some embodiments it may be only a very small part. It is also true of their sizes in an absolute sense. They may be several tens of square miles or several hundreds of square miles, for example.

Figure 2:
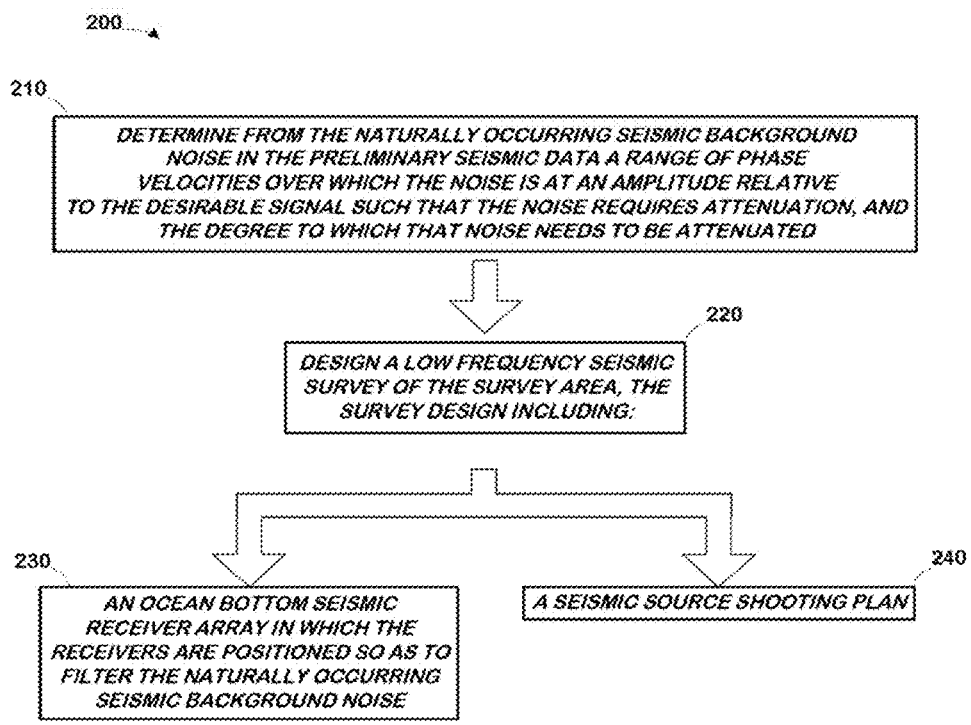
FIG. 2 illustrates a computer-implemented method in accordance with one aspect of the presently disclosed technique.

The presently disclosed technique includes a computer-implemented method 200, illustrated in FIG. 2, for designing a low-frequency marine seismic survey. In this context, "low-frequency" means frequencies less than about 6-8 Hz. Some embodiments will be below about 4 Hz, some of which may employ frequencies as low as about 2 Hz, or about 1.5 Hz, or about 0.5 Hz. The term "about" is a recognition that in acquisition seismic sources may come out of calibration or be poorly calibrated, simultaneously radiate at additional frequencies (for example from harmonics or from noise from a compressor), or that their signals can drift or in other ways deviate from what is desired. Thus, the term "about" means that the actual frequency is within the operational error acceptable to those in the art relative to the desired frequency of acquisition.

Returning now to FIG. 1-FIG. 2, the survey will be conducted by towing one or more low-frequency, marine seismic sources (not shown) through the water column 115 with a receiver grid (not shown) positioned on the seabed 120. Since it is known that the survey will be conducted using low seismic frequencies, it is also known that the naturally occurring seismic background noise 110 may create issues in the resultant data set. Accordingly, the method 200 attempts to mitigate those issues in the survey design by designing a receiver array that will suppress the naturally occurring seismic background noise 110 in the seismic data collected in the survey.

To design a receiver array to attenuate naturally occurring seismic background noise implies an a priori knowledge of that noise. This knowledge may be gleaned from previously acquired seismic data which, for present purposes shall be referred to as the "preliminary seismic data set." Thus, the method 200 first determines (at 210) from the naturally occurring seismic background noise in the preliminary seismic data a range of phase velocities over which the noise is at an amplitude relative to the desirable signal such that the noise requires attenuation, and the degree to which that noise needs to be attenuated.

The method 200 admits wide variation as to the origin of the preliminary data. It may be a legacy of a previous, conventional acquisition, i.e., "legacy" data. Or it may be acquired in conventional fashion for the very purpose of implementing the present technique. It may also be from a low-frequency acquisition in some embodiments. The manner and time frame in which the preliminary seismic data are acquired is not material to the practice of the technique. Regardless of these types of considerations, however, the receiver grid through which the preliminary seismic data are acquired should provide a sensor density sufficient that the naturally occurring seismic background noise 110 is not aliased. One particular embodiment achieves such a density with a sensor spacing of 450 m.

The preliminary data should be acquired in the survey area 100 or, if not, within the area of interest 105. The naturally occurring seismic background noise 110 can be directly determined if the preliminary seismic data are acquired within the survey area 100. However, this is not necessarily required, and the naturally occurring seismic background noise 110 may be estimated from seismic data acquired within the area of interest 105. As those in the art will appreciate, the naturally occurring seismic background noise 110 will vary depending on location. Thus, if the preliminary data are acquired in the area of interest 105, the naturally occurring seismic background noise 110 is estimated rather than directly determined.

This implicitly limits the area of interest 105 to an area in which any acquired seismic data contains a naturally occurring seismic background noise 110 that is at least similar to that found in the survey area 100. Since the naturally occurring seismic background noise 110 varies depending on location, so too does the area of interest 105. One particular embodiment considers the area of interest 105 to be limited to the basin in which the survey area 100 is contained.

The frequency range and amplitudes of the naturally occurring seismic background noise will generally vary with the season and the sea state. This variation can also be measured or estimated, and may be used to improve planning estimates of background noise levels. For example, if the noise levels are measured in summer, but the acquisition will be performed in winter, the noise level estimates from the summer may be seasonally adjusted to provide a better estimate of their likely winter levels.

The preliminary seismic data should also be amenable to a "box wave" analysis. One suitable box wave analysis is described in the context of a land survey in Chapter 11 of *Carbonate Seismology*, Volume 6, Palaz et al. eds. (1997). In this context, the acoustic waves from which seismic data are recorded are relatively weaker, but with a relatively faster phase velocity, than the naturally occurring seismic background noise 110. This is a classic "box wave" scenario, particularly when the naturally occurring seismic background noise 110 arrives from a known range of azimuths. The method 200 therefore seeks to mitigate or suppress the naturally occurring seismic background noise 110 through a receiver array designed (at 220) to attenuate the undesired slower wave modes but pass waves with faster phase velocities.

Accordingly, the method 200 then designs (at 220) a low-frequency seismic survey of the survey area. This includes both an ocean bottom seismic receiver array (at 230) in which the receivers are positioned so as to filter the naturally occurring seismic background noise 110 and a seismic source shooting plan (at 240).

Figure 3:
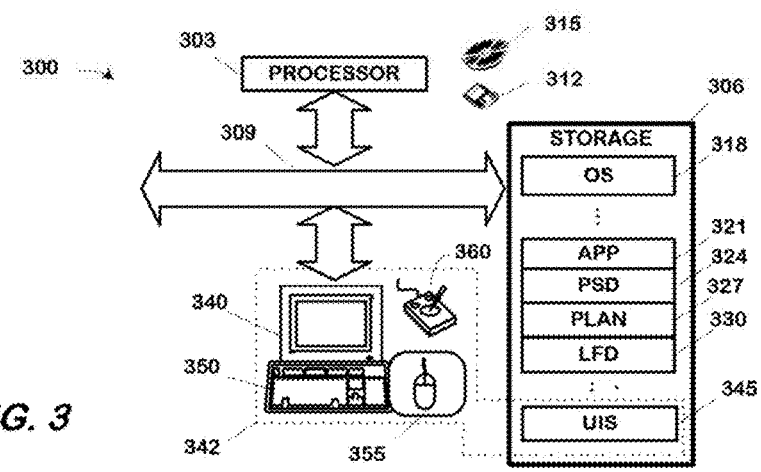
FIG. 3 shows selected portions of the hardware and software architecture of a computing apparatus such as may be employed in some aspects of the presently disclosed technique.

Those in the art having the benefit of this disclosure will also appreciate that the aspect of the presently disclosed technique illustrated in FIG. 2 is computer-implemented. FIG. 3 conceptually depicts selected portions of the hardware and software architecture of a computing apparatus 300 such as may be employed in some aspects of the present invention. The computing apparatus 300 includes an electronic processor 303 communicating with storage 306 over a communication medium 309.

The electronic processor 303 may be any suitable electronic processor or processor set known to the art. Those in the art will appreciate that some types of processors will be preferred in various embodiments depending on familiar implementation-specific details. Factors such as processing power, speed, cost, and power consumption are commonly encountered in the design process and will be highly implementation specific.

Because of their ubiquity in the art, such factors will be easily reconciled by those skilled in the art having the benefit of this disclosure. Those in the art having the benefit of this disclosure will therefore appreciate that the electronic processor 303 may theoretically be an electronic micro-controller, an electronic controller, an electronic microprocessor, an electronic processor set, or an appropriately programmed application specific integrated circuit ('ASIC'), field programmable gate array ("FPGA"), or graphical processing units ("GPUs"). Some embodiments may even use some combination of these processor types.

However, those in the art will also appreciate that data sets such as the preliminary seismic data ("PSD") 324 are quite voluminous and that the processing described herein is computationally intensive. Typical implementations for the electronic processor 303 therefore actually constitute multiple electronic processor sets spread across multiple computing apparatuses working in concert. One such embodiment is discussed below. These considerations also affect the implementation of the storage 306 and the communication medium 309 similarly.

The storage 306 may include a hard disk and/or random access memory ("RAM") and/or removable storage such as a floppy magnetic disk 312 and an optical disk 315. The storage 306 is encoded with a number of software components. These components include an operating system ("OS") 318; an application 321; a data structure comprised of the preliminary seismic data 324; and, once developed, a low-frequency, marine seismic survey design 327. Some embodiments may also include a data structure comprised of low-frequency, marine seismic data ("LFD") 330. The storage 306 may be distributed across multiple computing apparatuses as described above.

As with the electronic processor 303, implementation-specific design constraints may influence the design of the storage 306 in any particular embodiment. For example, as noted above, the disclosed technique operates on voluminous data sets which will typically mitigate for various types of "mass" storage such as a redundant array of independent disks ("RAID"). Other types of mass storage are known to the art and may also be used in addition to or in lieu of a RAID. As with the electronic processor 303, these kinds of factors are commonplace in the design process and those skilled in the art having the benefit of this disclosure will be able to readily balance them in light of their implementation specific design constraints.

The electronic processor 303 operates under the control of the OS 318 and executes the application 321 over the communication medium 309. This process may be initiated automatically, for example upon startup, or upon user command. User command may be directly through a user interface. To that end, the computing system 300 of the illustrated embodiment also employs a user interface 342.

The user interface 342 includes user interface software ("UIS") 345 and a display 340. It may also include peripheral input/output ("I/O") devices such as a keypad or keyboard 350, a mouse 355, or a joystick 360. These will be implementation-specific details that are not germane to the presently disclosed technique. For example, some embodiments may forego peripheral I/O devices if the display 340 includes a touch screen. Accordingly, the presently disclosed technique admits wide variation in this aspect of the computing system 300 and any conventional implementation known to the art may be used.

Furthermore, there is no requirement that the functionality of the computing system 300 described above be implemented as disclosed. For example, the application 321 may be implemented in some other kind of software component, such as a daemon or utility. The functionality of the application 321 need not be aggregated into a single component and may be distributed across two or more components. Similarly, the data structures for the preliminary seismic data 324 and low-frequency, marine seismic data 330 may be implemented using any suitable data structure known to the art.

As with the electronic processor 303 and the storage 306, the implementation of the communications medium 309 will vary with the implementation. If the computing system 300 is deployed on a single computing apparatus, the communications medium 309 may be, for example, the bus system of that single computing apparatus. Or, if the computing system 300 is implemented across a plurality of networked computing apparatuses, then the communications medium 309 may include a wired or wireless link between the computing apparatuses. Thus, the implementation of the communications medium 309 will be highly dependent on the particular embodiment in ways that will be apparent to those skilled in the art having the benefit of this disclosure.

Note that the various sets of data 324, 330 discussed herein are collections of ordered data representative of a tangible, real world, natural environment. This includes tangible, real world objects that comprise that environment, although in some cases it may include data characterizing a signal. For example, seismic data are information characterizing the subterranean formations from which it is generated. Similarly, the survey plan 327 also represents a tangible, real world environment, namely the placement and operation of survey components during a seismic survey.

The seismic data 324, 330 and the survey plan 327 may, or may not be, rendered for human perception either by electronic display or by hard copy reduction depending upon the particular embodiment being implemented. The disclosed technique is indifferent as to whether such a rendering occurs. The seismic data 324, 330 and the survey plan 327 in the illustrated embodiments are not rendered but are instead analyzed without rendering.

Some portions of the detailed descriptions herein are therefore presented in terms of a software implemented process involving symbolic representations of operations on data bits within a memory in a computing system or a computing device. These descriptions and representations are the means used by those in the art to most effectively convey the substance of their work to others skilled in the art. The process and operation require physical manipulations of physical quantities that will physically transform the particular machine or system on which the manipulations are performed or on which the results are stored. Usually, though not necessarily, these quantities take the form of electrical, magnetic, or optical signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated or otherwise as may be apparent, throughout the present disclosure, these descriptions refer to the action and processes of an electronic device, that manipulates and transforms data represented as physical (electronic, magnetic, or optical) quantities within some electronic device's storage into other data similarly represented as physical quantities within the storage, or in transmission or display devices. Exemplary of the terms denoting such a description are, without limitation, the terms "processing," "computing," "calculating," "determining," "displaying," and the like.

Furthermore, the execution of the software's functionality transforms the computing apparatus on which it is performed. For example, acquisition of data will physically alter the content of the storage, as will subsequent processing of that data. The physical alteration is a "physical transformation" in that it changes the physical state of the storage for the computing apparatus.

Note also that the software implemented aspects of the invention are typically encoded on some form of program storage medium or, alternatively, implemented over some type of transmission medium. The program storage medium may be magnetic (e.g., a floppy disk or a hard drive) or optical (e.g., a compact disk read only memory, or "CD ROM"), or charge based (e.g., a flash memory) and may be read only or random access. Similarly, the transmission medium may be twisted wire pairs, coaxial cable, optical fiber, or some other suitable transmission medium known to the art. The invention is not limited by these aspects of any given implementation.

Those in the art will appreciate that the technique described above may be a part of a larger process stretching from acquisition of the preliminary seismic data 324 through the conduct of the low-frequency, marine seismic survey for which the survey plan 327 is developed. To further an understanding of the presently disclosed technique, its role in such a larger process will now be disclosed in one particular embodiment.

Figure 4:
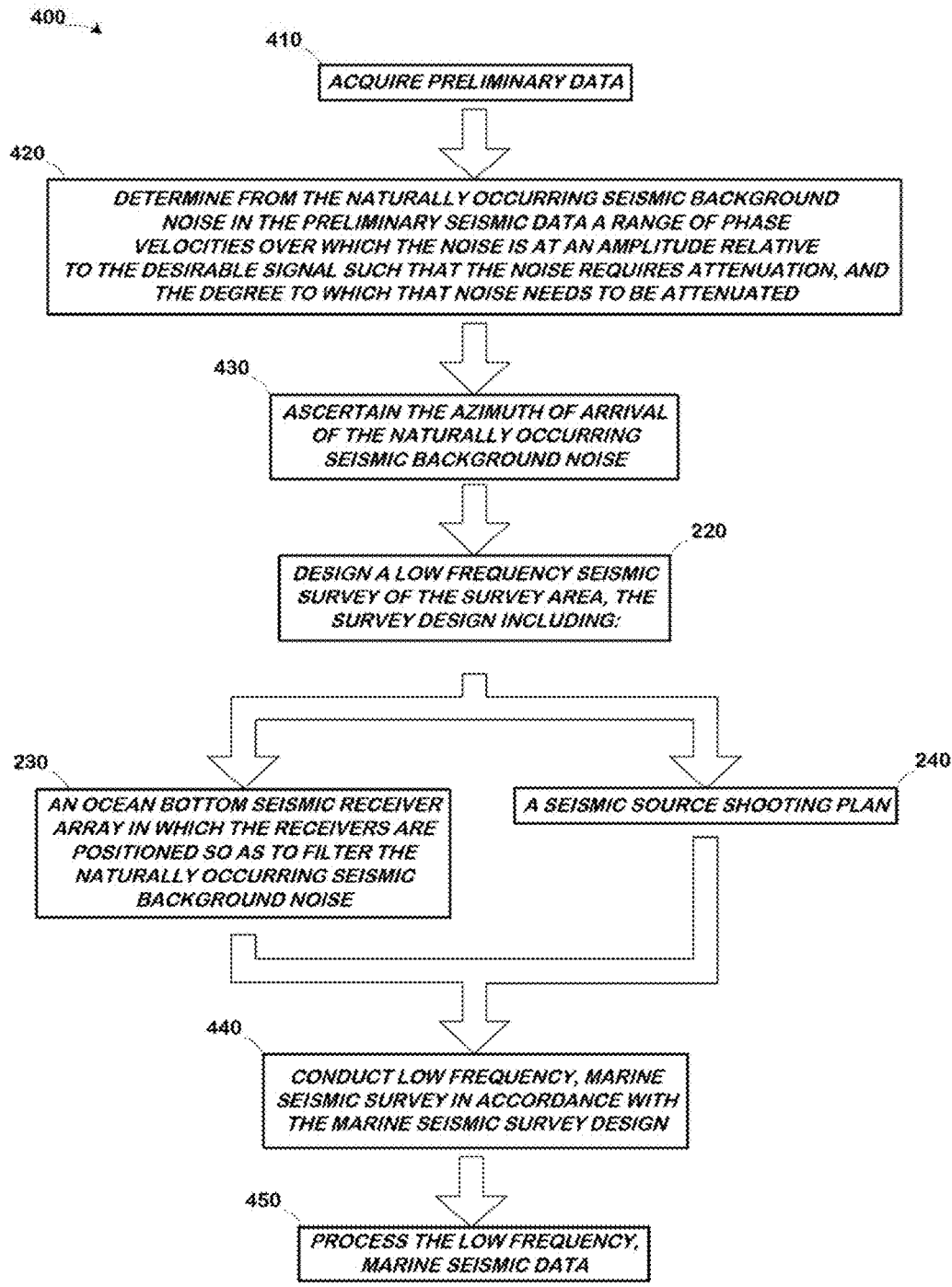
FIG. 4 illustrates one particular embodiment in which the technique first illustrated in FIG. 2 forms one part of a larger process.

Turning now to FIG. 4, this particular embodiment 400 begins with the acquisition (at 410) of the preliminary seismic data. This seismic data are "preliminary" only in the sense of its role in the development of a subsequent low-frequency, marine seismic survey. It may have at one time been the object in and of itself in the conduct of the survey in which it was acquired. In that context, it may not have been "preliminary" at all. In the present context, it is considered "preliminary" because it is not the seismic data collected during the low-frequency marine seismic survey it will be used to design.

Figure 5:
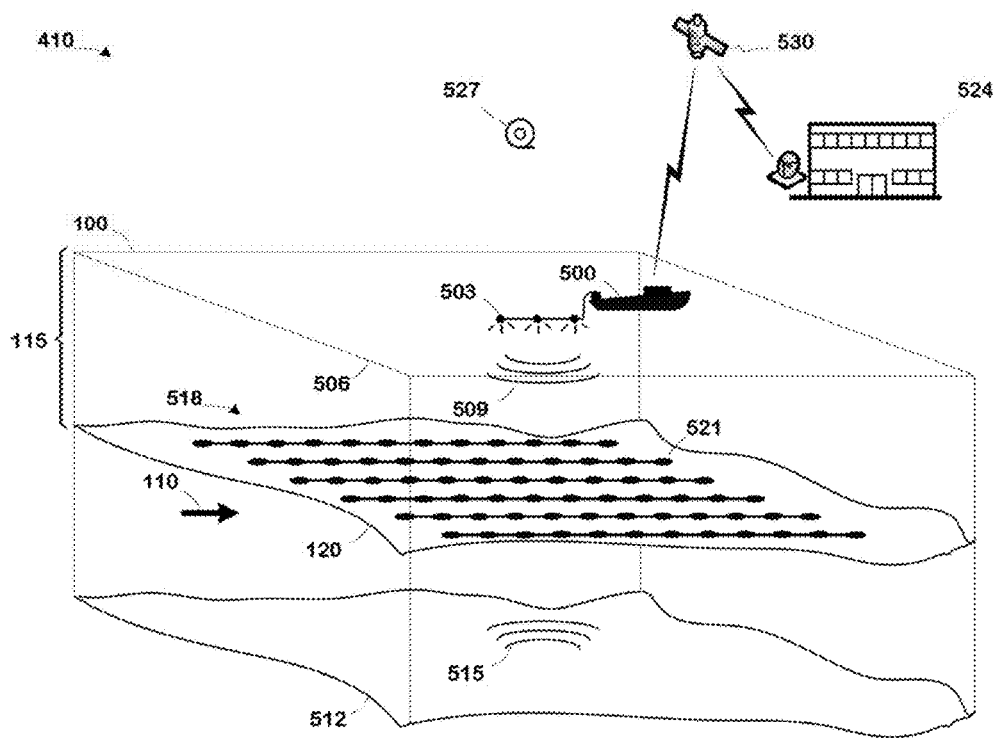
FIG. 5 conceptually depicts the acquisition of the preliminary data set in the embodiment of FIG. 4.

Referring now to FIG. 5, the acquisition 410 is performed in a conventional ocean bottom survey in this particular case. A tow vessel 500 tows one or more conventional sources 503 that may be, for example, airguns or sweep sources such as are known in the art, on the water's surface 506. The source(s) 503 impart one or more seismic signals 509 into the water column 115 to penetrate the seabed 120 and where they interact with subterranean structures 512, causing a portion of the seismic energy 515 to return toward the surface.

Figure 6:
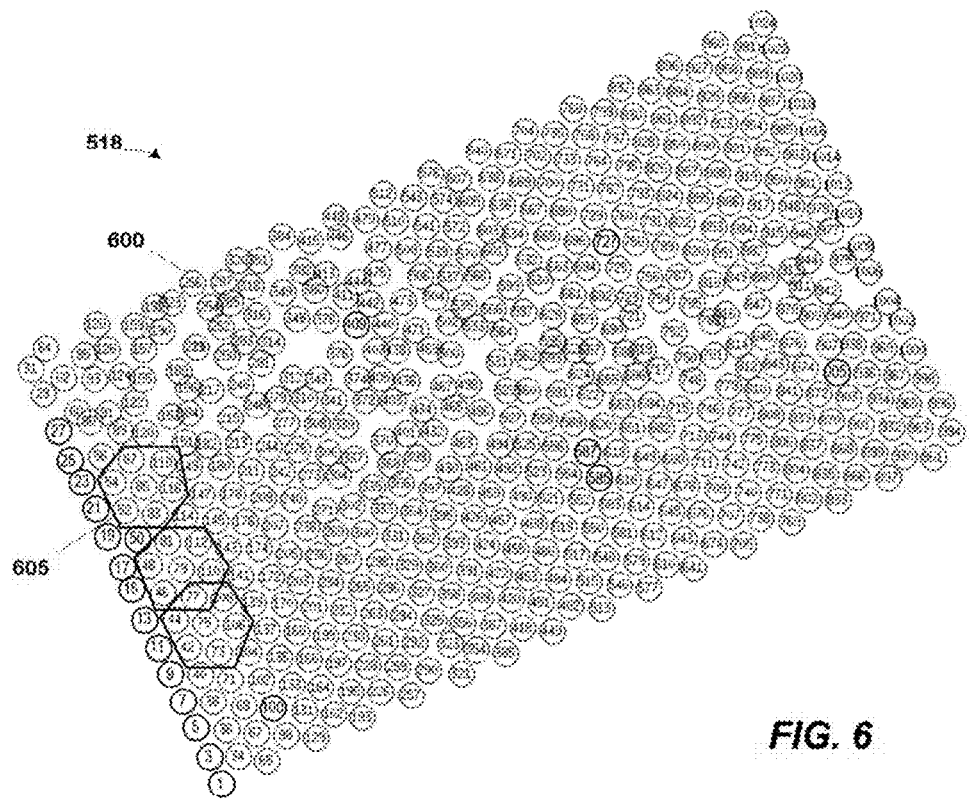
FIG. 6 illustrates an exemplary receiver acquisition grid such as the one used in the acquisition of FIG. 5.

The returning seismic energy 515 then propagates back to the receiver grid 518 on the seabed 120. The receiver grid 518 includes a plurality of receivers 521 (only one indicated). FIG. 6, adapted from Dellinger, J., and J. Ehlers, "Low Frequencies With a 'dense' OBS Array: The Atlantis Green-Canyon Earthquake Dataset.", in 2007 SEG Annual Meeting abstracts, Society of Exploration Geophysicists (2007), maps the receiver positions in one particular implementation of the receiver grid 518, each numbered circle 600 (only one indicated) representing a receiver 521. Note the receiver density (i.e., ≤450 m), which will mean that the naturally occurring seismic background noise 110 will be unaliased. The receivers 521 themselves could be hydrophones, geophones, or multicomponent depending on the implementation. The returning seismic energy 515 is detected by the receivers 521 and recorded as seismic data. Recorded data that contain energy from known manmade seismic sources 503 are called "active" seismic data.

The receivers 521 also record seismic data due to natural sources, in particular they record when there are no nearby conventional active sources 503 operating. Data recorded in the absence of known manmade sources are called "passive" seismic data. In this particular embodiment, the active and passive seismic data recorded by the receivers 521 become the "preliminary seismic data". The recorded preliminary seismic data are then communicated to a computing facility 524. This communication may be, for example, by hard copy on a magnetic tape 527 or by transmission via a satellite 530.

Figure 7:
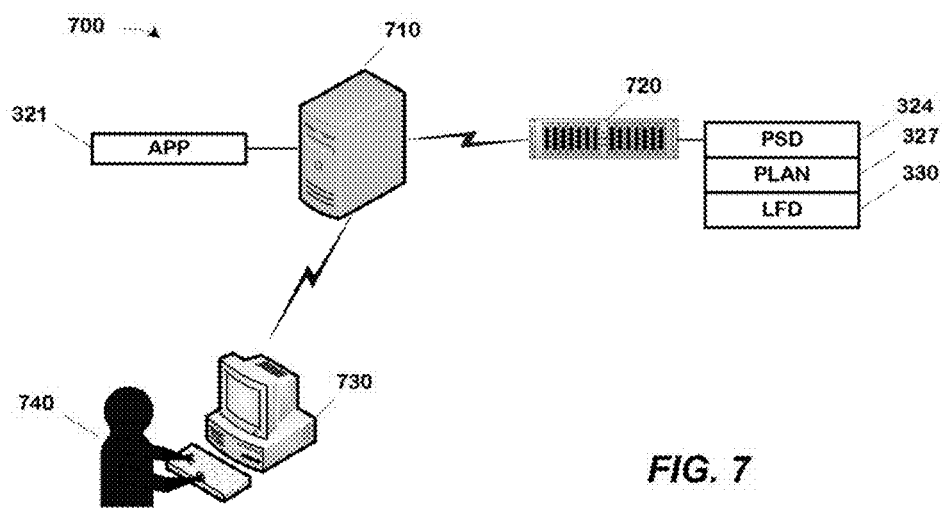
FIG. 7 illustrates one particular embodiment of the computing apparatus of FIG. 3 as used in the embodiment of FIG. 4 and which is, more particularly, a computing system on which some aspects of the present invention may be practiced in some embodiments.

The computing facility 524 houses a computing system by which the preliminary seismic data are processed as described above to design the low-frequency seismic survey. A portion of an exemplary computing system 700 is shown in FIG. 7. The computing system 700 is networked, but there is no requirement that the computing system 700 be networked. Alternative embodiments may employ, for instance, a peer-to-peer architecture or some hybrid of a peer-to-peer and client/server architecture. The size and geographic scope of the computing system 700 is not material to the practice of the invention. The size and scope may range anywhere from just a few machines of a Local Area Network ("LAN") located in the same room to many hundreds or thousands of machines globally distributed in an enterprise computing system.

The computing system 700 comprises, in the illustrated portion, a server 710, a mass storage device 720, and a workstation 730. Each of these components may be implemented in their hardware in conventional fashion. Alternative embodiments may also vary in the computing apparatuses used to implement the computing system 700. Those in the art will furthermore appreciate that the computing system 700, and even that portion of it that is shown, will be much more complex. However, such detail is conventional and shall not be shown or discussed to avoid obscuring the subject matter claimed below.

In FIG. 7, the application 321 is shown residing on the server 710 while the preliminary seismic data 324, marine seismic survey plan 327, and the low-frequency seismic data 330 are shown residing in the mass storage 720. While this is one way to locate the various software components, the technique is not dependent upon such an arrangement. Although performance concerns may mitigate for certain locations in particular embodiments, the situs of the software components is otherwise immaterial.

Returning to FIG. 4, the preliminary seismic data 324 are analyzed to determine (at 420) from the naturally occurring seismic background noise 110 in the survey area 100 in the preliminary seismic data a range of phase velocities over which the noise is at an amplitude relative to the desirable signal such that the noise requires attenuation, and the degree to which that noise needs to be attenuated. The azimuth of arrival for the naturally occurring seismic background noise 110 is also ascertained (at 430). This can be done by performing what is known in the art as a "radar" analysis of the preliminary seismic data 324. The radar analysis can be performed by the application 321, shown in FIG. 7, for example, responsive to input by the user 740.

Figure 14:
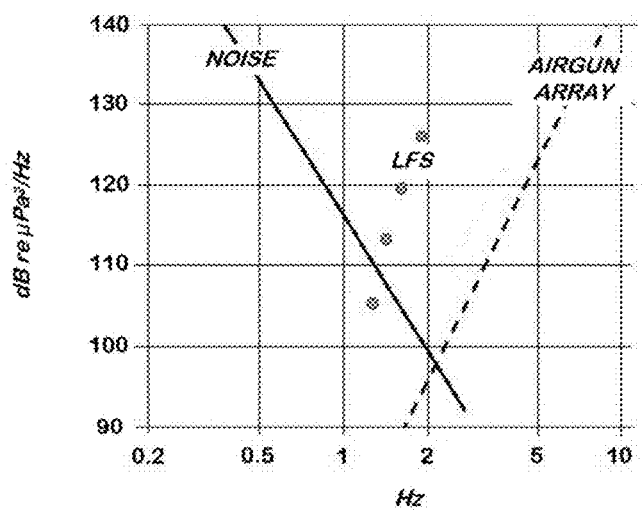
FIG. 14 schematically depicts signal versus noise for ocean-bottom data from the deep water Gulf of Mexico FIG. 15 schematically depicts a "Radar" analysis for ocean-bottom data from the deep water Gulf of Mexico.
Figure 15:
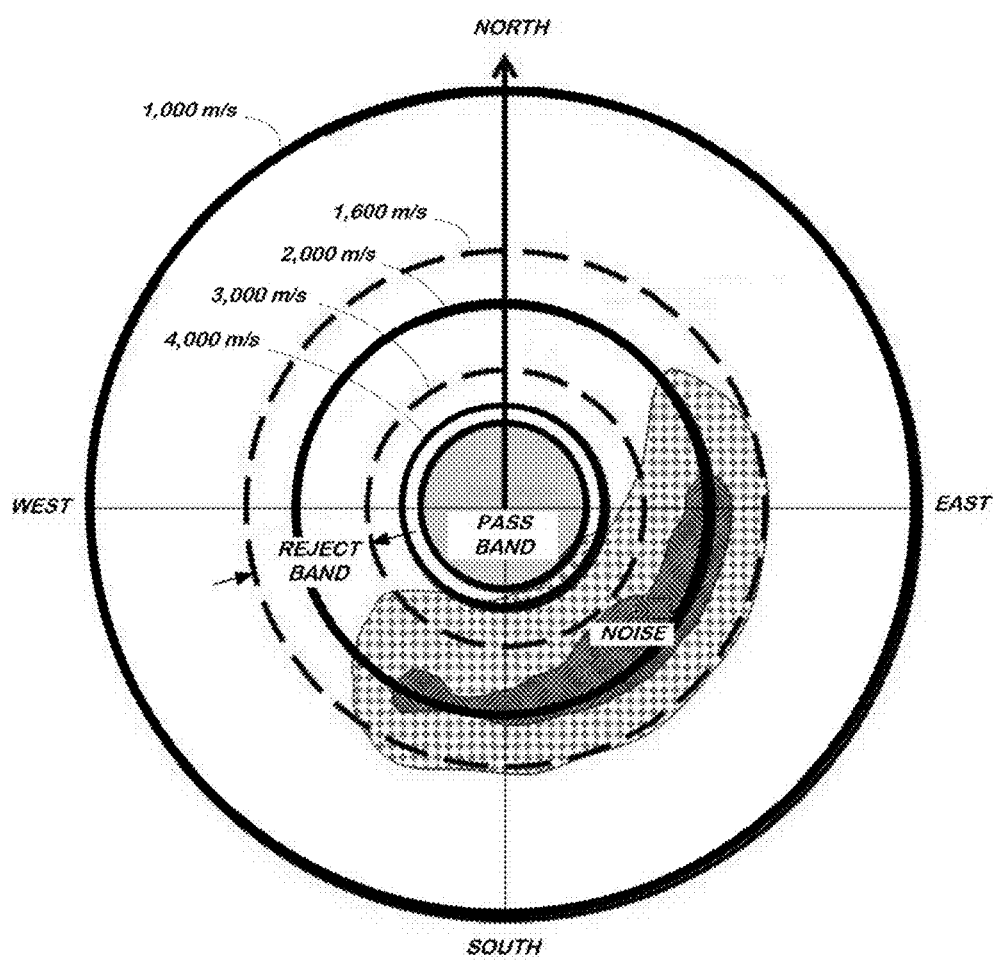

FIGS. 14 and 15 show an example of how one might determine the phase velocities (at 420) and the azimuths (at 430). To determine the amplitude of the background noise, calibrated power spectra are plotted for time windows extracted from both the active and passive preliminary seismic data. In some embodiments, the active and passive preliminary seismic data may be extracted from different seismic surveys. FIG. 14 shows a representation of typical active and passive power spectra for ocean-bottom seismic data from the deep water Gulf of Mexico. In the active-data time window shown in FIG. 14, the sources were conventional airguns located about 2.5 km from the receiver. Over the frequency range of interest (0.5-6 Hz) the background noise and the energy from conventional sources can be well approximated as straight lines on a log-log plot, as shown here.

The active-source data may be plotted for a range of source locations, showing how the amplitude of conventional sources varies with source-receiver offset, and thus how the signal to noise ratio varies with source-receiver offset. Alternatively, the amplitude curve for a known offset may be shifted up and down to model the amplitude at other offsets, based on a model of how amplitude should vary with offset, for example spherical spreading.

Note that for conventional airgun sources in the deep water Gulf of Mexico, below 2 Hz the active data closely approximates passive data even for relatively nearby active sources. Thus an analysis of the amplitude of the ambient noise below about 2 Hz can be made even from conventional active data, because conventional seismic sources produce very little energy in this frequency range. For some ocean basins ambient-noise spectra have been published and are freely available, and this is another possible source of data about ambient noise levels. The ambient-noise spectra vary with season and sea state, and this variation may be accounted for when estimating what ambient noise levels to design for.

Modeling of the expected imaging challenge will determine how low a frequency, with what signal to noise at what maximum source-receiver offset, is expected to be required to image the subsurface structures of interest. Alternatively, empirical experience with similar imaging challenges in similar basins may be used to estimate these.

The dots labeled "LFS" in FIG. 14 indicate a range of possible single-frequency "humming" sweeps that are available from a controllable low-frequency source (LFS). Additional information regarding frequency humming sweeps may be found in U.S. application Ser. No. 13/327,524 and U.S. Application Ser. No. 61/896,394, incorporated by reference below. Other types of sweeps, for example narrow-band sweeps of a restricted frequency range over an octave or less, could also be used. Note the low-frequency source has greatly reduced bandwidth compared to airguns, but can achieve a much higher signal to noise over a restricted frequency range. However, as for airguns, the achievable power rapidly declines as the frequency decreases, so there is a tradeoff to be optimized between frequency and signal to noise.

The signal achievable from a controllable low-frequency source performing a particular sweep may be empirically measured, or it may be estimated based on considerations such as the size of the device, the water it displaces, the force it applies to the water, the estimated spreading and attenuation of the signal in the subsurface, etc., or a combination of both. If insufficient source signal is expected to be available at the required lowest frequency, then the shortfall in dB should be calculated (for example from a plot like FIG. 14), to be followed by an investigation into how to increase the signal to noise by attenuating the noise by at least that amount. One possible solution is to boost the signal by building a larger device or employing an array of sources. The alternative solution, described here, is to attenuate the noise relative to the signal.

FIG. 15 shows a schematic "radar" plot for pressure data from an ocean-bottom node grid in the deep water Gulf of Mexico. The polar plot shows energy across a grid (such as is shown in FIG. 6) as a function of phase slowness (inverse horizontal phase velocity) and azimuth. Zero phase slowness (indicating a wave impinging on all parts of the grid simultaneously) plots in the center. The outer rim indicates energy moving at 1000 m/s, energy traveling North-to-South at that velocity at the top edge of the plot, West-to-East at that velocity at the left edge, etc.

For this example the energy is mostly coming from a range of azimuths centered on the Southeast, at a range of phase velocities between about 1600 and 3000 meters per second. The desirable active-source data arrives at higher velocities which would plot nearer to the center of the plot. The azimuth, amplitude, and frequency range of the ambient noise may vary with season and weather, but the range of velocities is a function of the local geology and should not change. Thus by picking a range of phase slownesses to attenuate and the required dB noise suppression over that range, we may design an appropriate receiver array, as is well known to those skilled in the art of box wave analysis.

A receiver array is specified by its geometry and the set of weights $A_j$ applied to the elements of the array (here the elements are indexed by j). One preferred type of array well known in the art is a "Chebychev array", which maximizes the minimum attenuation over a specified reject band. Other types of arrays with different useful properties are also possible and are known to those skilled in the art of array design for surface-wave noise attenuation.

A radar analysis may also be performed on the active data, to determine the velocities and azimuths of the energy from an active source, to ensure that the array does not also overly attenuate the desirable signal. Active sources may also generate undesirable signals such as surface waves and ideally the array may also attenuate these.

Once the naturally occurring seismic background noise 110 and its azimuth of arrival are ascertained (at 420, 430), the method 400 then designs (at 220) a low-frequency seismic survey 327 of the survey area 100. This includes both an ocean bottom seismic receiver array (at 230) in which the receivers are positioned so as to filter the naturally occurring seismic background noise 110 and a seismic source shooting plan (at 240). As described above, the receiver array is designed to attenuate the naturally occurring seismic background noise 110, and the seismic source shooting plan complements the receiver array design.

Continuing with this particular specific example, a receiver array filters seismic energy by its wavenumber (one over the wavelength of the wave measured along the recording surface). To determine the minimum and maximum wavenumber, one determines the minimum and maximum phase velocities to be attenuated over, and the minimum and maximum frequencies of interest. The minimum wavenumber is then the minimum frequency divided by the maximum phase velocity, and the maximum wavenumber is the maximum frequency divided by the minimum phase velocity.

For this example the minimum and maximum frequency are both 1.6 Hz, so the minimum wavenumber is 1.6 Hz/3000 m/s, and the maximum wavenumber is 1.6 Hz/1600 m/s. An optimal array has its Nyquist sample spacing centered between these minimum and maximum wavenumbers. For this example, if d is the array spacing then ½ d=½(1.6/3000+1.6/1600), and we find d=652.17 or about 650 meters.

Figure 12:
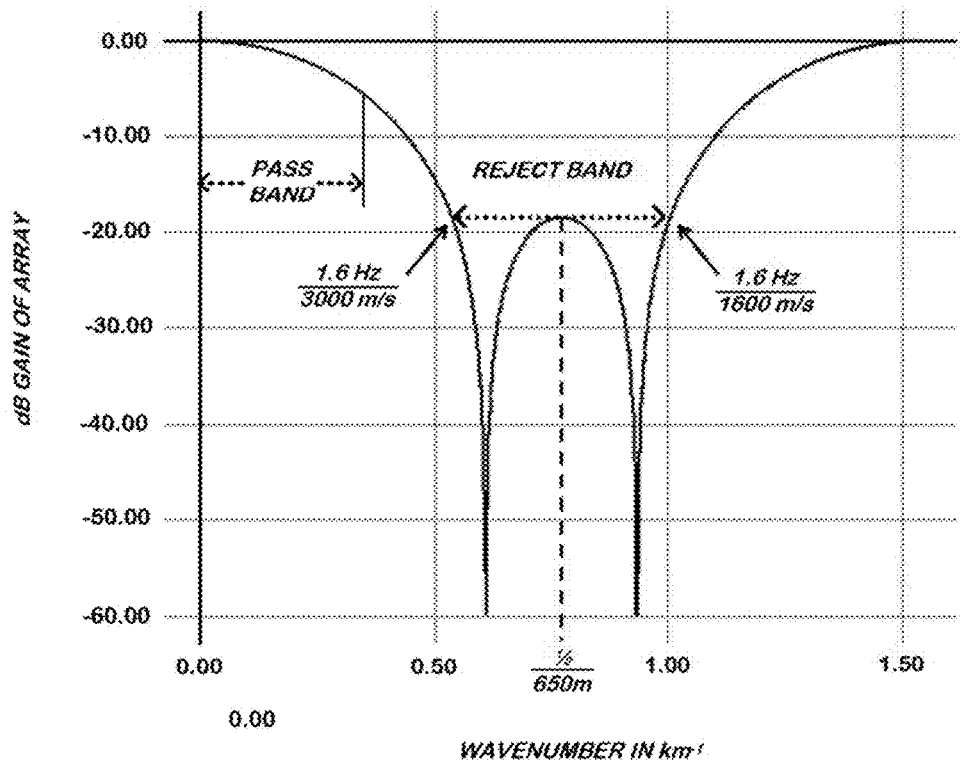
FIG. 12 depicts the attenuation of the 3×3 Chebychev arrays depicted in FIG. 8.

FIG. 12 shows the attenuation of a 3×3 Chebychev array for this example, which achieves a minimum attenuation of about 18 dB over the required wavenumber interval. Alternative embodiments using other types of arrays are also possible, for example the gain over the reject band may be adjusted to match the shape of the noise spectrum over that wavenumber window. Other array configurations are also possible, for example hexagonal arrays 605 (only one indicated) as illustrated in FIG. 6, or the arrays may have different spacings along different axes. In embodiments, the node deployment method might preclude being able to precisely specify where the nodes land. The array design may be modified to take account of the fact that the deployed array may only approximate the acquisition design, due to constraints on where nodes may be located or how accurately they can be placed.

The minimum attenuation of a Chebychev array is a function of the ratio of the minimum and maximum wavenumbers and the number of elements in the array. Arrays with more elements achieve higher attenuation, but at greater acquisition expense, as is well known to those skilled in the art of array design. Note the design principles exemplified here are the same as for land array design, for which these tools and this methodology were originally designed. Land arrays typically must handle broadband data, so much larger arrays are used in that case, typically 12×12 at a minimum. For the low-frequency seismic imaging application of particular interest, full-waveform inversion, only a small number of separated discrete frequencies are required.

In this example we do not need to design a broadband array because as shown in FIG. 14, the signal to noise rapidly improves with increasing frequency. At higher frequencies a receiver array to suppress the ambient noise is not required, so arrays will only be required at the lowest frequency used in the survey. Because we are only attempting to design an array that attenuates noise at a single frequency, even a humble 3×3 array can provide significant noise rejection.

Outside of the frequency band that the array was designed for, it may not provide much noise rejection. However, noise outside the frequencies of interest can easily be suppressed by conventional frequency filtering in the time domain, so this is not a problem.

Figure 8:
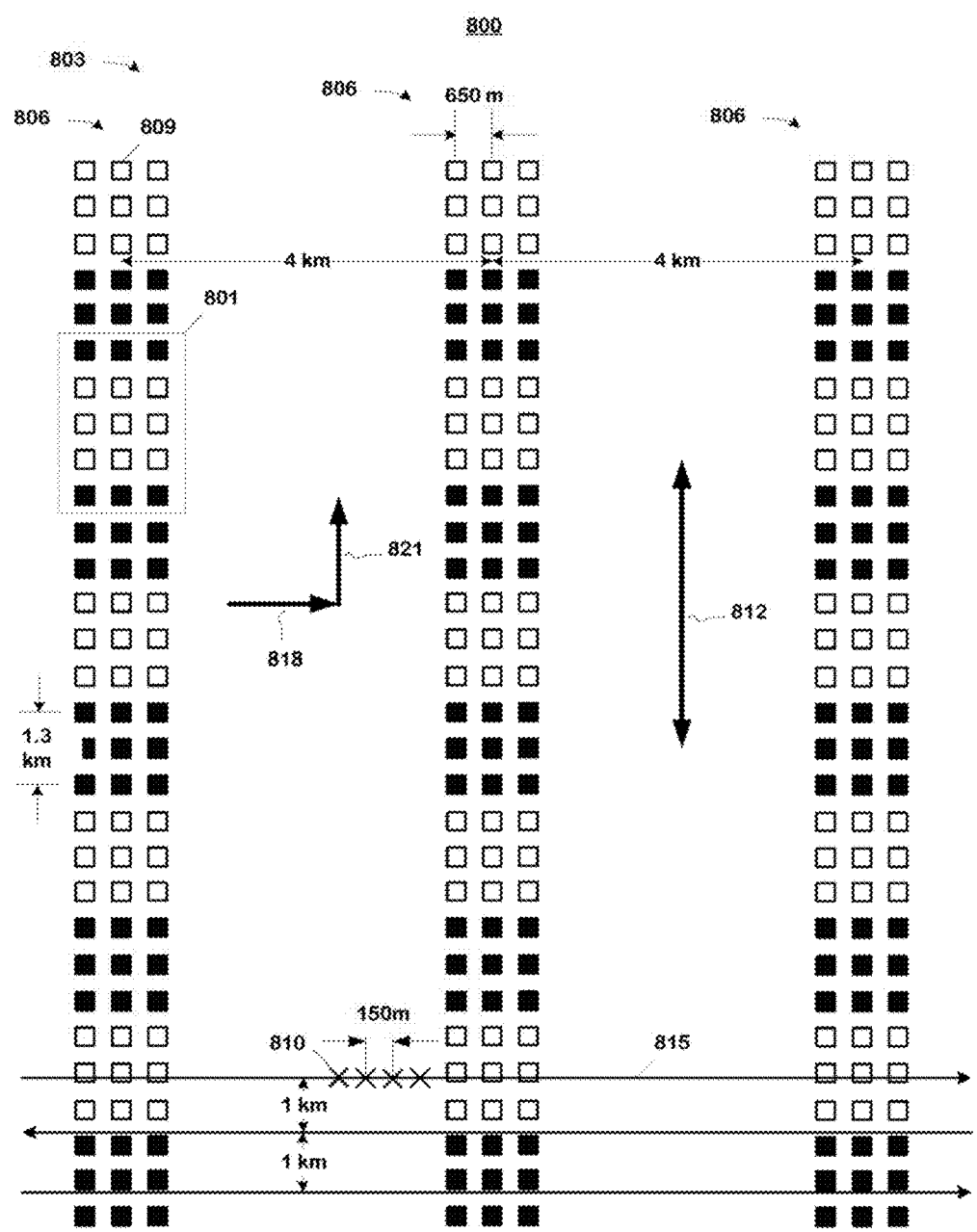
FIG. 8 depicts an exemplary survey design as might be constructed in some embodiments of the invention.

Once the receiver arrays have been designed, they are incorporated into the survey design. First the survey is designed in the conventional way assuming no noise, then each receiver node in the acquisition grid is replaced with a small array. Consider, for example, the marine seismic survey design 800, conceptually illustrated in FIG. 8. The technique disclosed herein does not necessarily render the marine seismic survey design 800 in a human perceptible form as was discussed above. FIG. 8 is used only to illustrate selected aspects of the marine seismic survey design 800 to further an understanding of the presently claimed subject matter.

The marine seismic survey design 800 includes a receiver grid 803 comprised of several receiver lines 806 spaced 4 km apart. In the absence of ambient noise, a single line of nodes 809 (only one indicated) would be spaced along this line at a spacing determined by the sampling requirements of the survey. (Each node represents a seismic receiver.) This shooting geometry, with shots that are densely spaced in one direction and receivers that are densely spaced in the orthogonal direction, may be referred to as "sparse 3D acquisition".

In FIG. 8, the shot spacing is dense along the horizontal axis of the figure, and the receivers are dense along the vertical axis of the figure. Representative shot locations 810 (only one indicated) are shown on the shot line 815 spaced at about 150 m apart. Here "dense" means "a sample spacing sufficiently fine to represent the wavefields of interest without aliasing". By the Nyquist sampling criterion, "dense" means a sample spacing≤½ V/F, where F is the frequency and V is the horizontal phase velocity of a wavefield of interest. "Sparse" is a sample density much less than this, i.e., a sample spacing>~3× that for a dense sample spacing.

In practice the lines need not be exactly orthogonal, but in this case the inline sample spacing of the deviated line should be multiplied by about the cosine of the deviation from orthogonality to maintain the same effective sampling. Thus, more shot or receiver points will be required and such a geometry is less efficient.

Other survey designs are possible. In particular, it has been discovered that full-waveform inversion ("FWI") does not need the same sort of coverage that is needed for imaging. FWI needs good sampling along each axis in either the shot domain or in the receiver domain, but not both. There are three fundamental ways to achieve the required sampling. A sparse 3D acquisition (such as in FIG. 8) achieves the required sampling with orthogonal shot and receiver lines, each dense in the inline direction, but coarse in the crossline direction.

Alternatively, in sparse receiver acquisition, the shots are areally dense, in which case the receivers may then be coarsely spaced. This is the typical acquisition strategy used at conventional frequencies, because it is much less expensive to acquire a dense coverage of sources (typically airguns towed behind a ship) than a dense coverage of ocean-bottom receivers (which may need to be manually placed one at a time by a remotely operated vehicle ('ROV')). FIG. 6 shows an example of such a receiver grid for a conventional seismic survey. The nodes are ~450 m apart, which is not dense at conventional seismic frequencies. Conventional seismic frequencies are primarily above about 6 Hz. The term "primarily" here denotes that some broadband sources (such as airguns) emit energy at many frequencies, some of which may be different from what is considered the nominal frequency of the signal. So, as recognized by those skilled in the art having the benefit of this disclosure, even signals nominally considered above 6 Hz can be accompanied by some lesser amounts of energy below 6 Hz. Thus, the signal is "primarily" above 6 Hz in this context.

However, this same receiver grid with nodes ~450 m apart becomes dense for frequencies below about 1.7 Hz. Thus in some embodiments, particularly in a "piggyback survey", where a receiver grid designed for a conventional survey is also used for low-frequency acquisition, sparse-shot acquisition may be used for the low-frequency acquisition. In sparse-shot acquisition the shots may be coarsely spaced, taking advantage of an areally dense receiver grid to achieve the required sampling (i.e., the receiver grid is dense along both horizontal axes). Note that a "piggyback survey" results in a single acquisition.

In the present context "coarse" means with spacings much greater than what is required with conventional frequencies, i.e., frequencies about 6-8 Hz. For example, one particular embodiment uses areally dense shots but quite coarse node spacings, e.g. a grid with nodes 4 km apart. However, the spacings should not be "excessively coarse", i.e. greater than about 10 km apart, which can yield more undesirable artifacts.

These observations might manifest themselves in a variety of acquisition strategies. For example, one might use a tighter grid of nodes (such as the grid in FIG. 6) over the central part of the model of interest doing double duty for conventional imaging purposes as well. These would then be surrounded by a much coarser grid of nodes sufficient to acquire ultra-wide offsets for FWI over the area of interest. Alternatively, an extensive areal coarse grid of nodes might be expensive, because the boat laying the nodes will need to traverse long distances between node placements and spend a lot of time traveling. If the survey does not require a rich offset distribution, then a more closely spaced line of nodes at one or more offsets away from the center of the area of interest might be a more cost-effective deployment strategy.

For example, a "wall of receivers" around the perimeter of the survey area might be enough. A variation of this would be "node coil shooting", where nodes are deployed in a spiral pattern, with the spiral arms relatively close together at the center, but far apart at the outer edge. Such a pattern could also surround a conventional Cartesian grid such as in FIG. 6. Or, if each new shot/receiver line adds great expense, but finer sampling within a shot or receiver line adds only incremental expense, this favors the use of sparse 3D acquisition, with widely spaced shot lines going one way, and widely spaced receiver node lines going the other way.

Whatever the chosen survey design, individual receivers in the design may be replaced with receiver arrays designed to attenuate the ambient noise relative to the desirable signal. Returning to the sparse 3D survey design in FIG. 8, the receiver lines thus become "fat" lines three nodes wide, with the nodes spaced 650 m apart in rectangular swaths. The nodes 809 along the fat receiver line are configured in 3×3 squares and are 1300 m per side. The illustrated patches 806 are representative and will be repeated sufficiently at those dimensions to cover the entire survey area 100. The square 3×3 node patches suppress noise approximately the same regardless of direction. However, the design consisting of three parallel lines also allows adjacent patches to overlap, and overlapping patches may have more than three rows of array elements along the axis of the fat receiver lines, for example the 5×3 receiver array 801. The axis of greatest suppression of this non-square array is indicated by the arrow 812.

Note a "fat receiver line" acquisition such as is illustrated in FIG. 8 is particularly suitable for ocean-bottom-cable or "nodes on ropes" systems. In an embodiment, nodes on ropes are ocean-bottom nodes that are self-powered independent recording units which are strung on cables that are used to deploy them. The inline position of the nodes within each cable or rope may be staggered to produce a "fat receiver line" acquisition with hexagonal receiver arrays, instead of square or rectangular as shown in FIG. 8. The effect of a "fat receiver line" may also be achieved by laying a single cable in a sinuous, zig-zag, sawtooth, or otherwise convoluted manner. For an untrenched cable such a layout may also result in better coupling to the seafloor.

The marine seismic survey design 800 also includes a seismic source shooting plan. FIG. 8 includes several representative indications of sail lines 815 (only one indicated) over which the seismic source (not shown) will be towed. The source inline direction is indicated by the arrow 818 and the crossline direction is indicated by the arrow 821. In this particular embodiment the sail lines 815 are 1 km apart.

Figure 9:
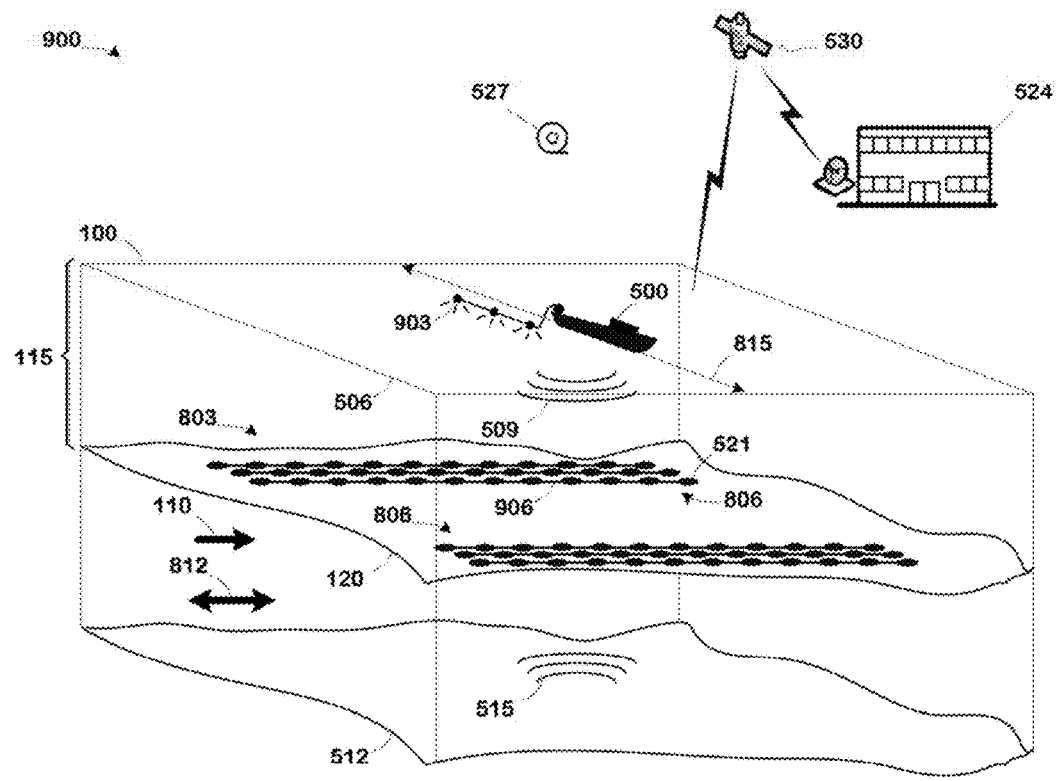
FIG. 9 conceptually illustrates a low-frequency, marine seismic survey conducted in accordance with the survey design of FIG. 8.

Returning to FIG. 4, the technique then conducts (at 440) a low-frequency, marine seismic survey in accordance with the marine seismic survey design 800. FIG. 9 conceptually illustrates one particular low-frequency, marine seismic survey 900 conducted in accordance with the survey design 800 illustrated in FIG. 8 arrived at as discussed above. The survey 900 is conducted much in the manner of the survey 500 in FIG. 5, modified as indicated by the survey design 800.

In particular, the survey 900 employs the low-frequency, marine seismic source 903. One suitable source is disclosed and claimed in U.S. Pat. No. 8,387,744. However, the presently disclosed technique is not limited to this particular source. Any suitable low-frequency, marine seismic source known to the art may be used. Note that to some degree what constitutes a "suitable" source may be constrained by the survey design 800. For example, if the survey design 800 calls for a sweeping seismic signal, then the source 903 must be capable of emitting sweeping seismic signals.

The survey 900 also uses the receiver grid 803 and seismic source shooting plan first illustrated in FIG. 8. The receivers 521 are deployed on ocean bottom cables ("OBCs") 906 (only one indicated) in this particular embodiment. The disclosed technique is not limited to this kind of deployment. There are several ways known to the art for deploying seismic receivers to the seabed and any of these may be used. Note that, in accordance with the survey plan 800, the axis of the sail lines 815 (only one shown) are transverse to the axis of the receiver lines.

Still referring to FIG. 9, the low-frequency seismic data recorded during the low-frequency seismic survey 900 is then transmitted to the computing facility 524 on magnetic tape 527 or by wireless transmission over the satellite 530. Turning now to FIG. 7, the user 740 invokes the application 321 from the workstation 730 to begin processing the low-frequency seismic data 330. Those skilled in the art will appreciate that the preliminary seismic data 324 may undergo pre-processing to condition the data for the processing that is to come. Such pre-processing is described in, for example, U.S. Pat. No. 7,725,266 and U.S. application Ser. No. 13/327,524. The type and amount of pre-processing will vary by embodiment in a manner that will become apparent to those skilled in the art having the benefit of this disclosure.

The processing (at 450, FIG. 4) may include, for example, one or more techniques known as "full-waveform inversion". As is well known to those of ordinary skill in the art, the transmission, reflection, diffraction, etc., of seismic waves within the earth can be modeled with considerable accuracy by the wave equation, and accordingly wave-equation-based wavefield-extrapolation engines are the method of choice for difficult imaging problems. The wave equation is a partial differential equation that can readily be couched in terms of one, two, or three dimensions.

For complex imaging challenges, the constant-density acoustic wave equation extrapolating in time is typically used as the extrapolation engine. Coupled with an imaging condition it yields an image of reflectors inside the earth. Imaging in this way is called "reverse-time migration".

The same extrapolation engine can also be used within an iterative optimization process that attempts to find an earth model that explains all of the seismic information recorded at the receivers. The iterative process numerically forward models waves propagating from the sources to the receivers, and compares this predicted data with what was actually recorded. The difference between these is the "data residual", which it then numerically backwards-propagates in reverse time from the receivers back into the simulated Earth. Correlating the forward-propagating source wavefield and the backwards-propagating residual wavefield produces an estimate of the error in the velocity model. The model is then updated and the iteration repeats.

This is called "full-waveform inversion", or "FWI". Ideally, inversion produces a 3-dimensional volume giving an estimated subsurface wave velocity at each illuminated point within the earth. If the acoustic wave equation is used, which incorporates both velocity and density as medium parameters, inversion may produce a 3-dimensional volume giving both the velocity and density at each point.

Most conventional FWI workflows are designed to work with data from impulsive sources. One commonly used technique to improve the convergence of FWI is to mute out later arrivals and inner offsets, forcing the FWI to only consider fast diving waves in the inversion. These diving waves have lower vertical wavenumbers, and thus provide the same benefits of having lower frequencies in the inversion without the need of having a lower-frequency source. In the absence of muting, these fast wide-offset arrivals would tend to be overwhelmed in the inversion by louder, later, more vertically traveling (and thus higher wavenumber) events.

Although the seismic data are acquired from a low-frequency source, processing techniques that allow inversion for even lower vertical wavenumbers will still be welcome. At the lowest frequencies, the seismic source used in this particular embodiment will emit seismic signals with a narrowband to monochromatic source sweep, which will produce a shot gather that approximates that shown in FIG. 10.

It will generally be difficult to mute out later arrivals because at low frequencies the power in the signal is relatively low compared to the power in the noise. We must therefore use a long time window in order to gather sufficient energy for processing, which precludes muting over a short time window to only allow through the fastest arrivals. Accordingly, the inversion is performed using a data window like the boxed area 1000 in FIG. 10. In the boxed area 1000 one can see that there are several events at various dips beating with each other over offset.

Figure 10:
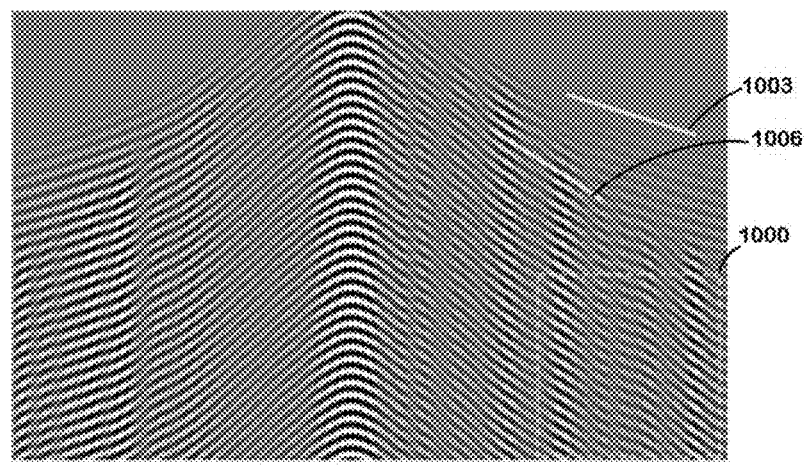
FIG. 10 depicts a shot gather that approximates one which would result from the low-frequency, marine survey of FIG. 9.

Although muting by time (i.e., the later arrivals) as is conventionally done is difficult, muting by offset is still desirable and feasible. One can also discriminate between events by their phase velocities, i.e., by their dip. For example, the two lines 1003, 1006 in FIG. 10 show that the faster early-arriving events 1003 have a noticeably faster phase velocity than the loud later arrivals 1006. However, while the early-arriving diving waves have a faster phase velocity, there are many later-arriving events that also have similarly fast phase velocities.

Muted data are typically used with an unmodified FWI algorithm. The missing later arrivals correspond to reflectors that are better imaged using conventional migration techniques anyway, so it is not an issue if FWI leaves them out. The problem is physically consistent, in that there is an Earth model that FWI can find that (mostly) explains the muted data. It has the low-wavenumber velocity structures that are desired, but leaves out some deeper reflectors.

The events with faster phase velocities correspond to various refracting and diving waves. It is not clear that there is an Earth model that generates these waves but leaves the slower events out. For this reason, it may be desirable to include dip filtering in the FWI algorithm itself. That is, when forward modeling to generate the predicted data inside the FWI algorithm, one would dip-filter to match the dip filtering done on the real data before calculating the residuals. This should make the problem FWI is attempting to solve "consistent". Dip filtering may also have other useful properties, such as attenuating the naturally occurring seismic background noise.

There are many FWI techniques known to the art suitable for modification in light of the considerations discussed above. While any of those techniques may be used, one particular one is disclosed in U.S. Pat. No. 7,725,266. This particular technique can be modified for use with the low-frequency seismic data 330 by foregoing the muting by time while maintaining the muting by offset. Some embodiments will also include dip filtering in the FWI algorithm itself.

Figure 16:
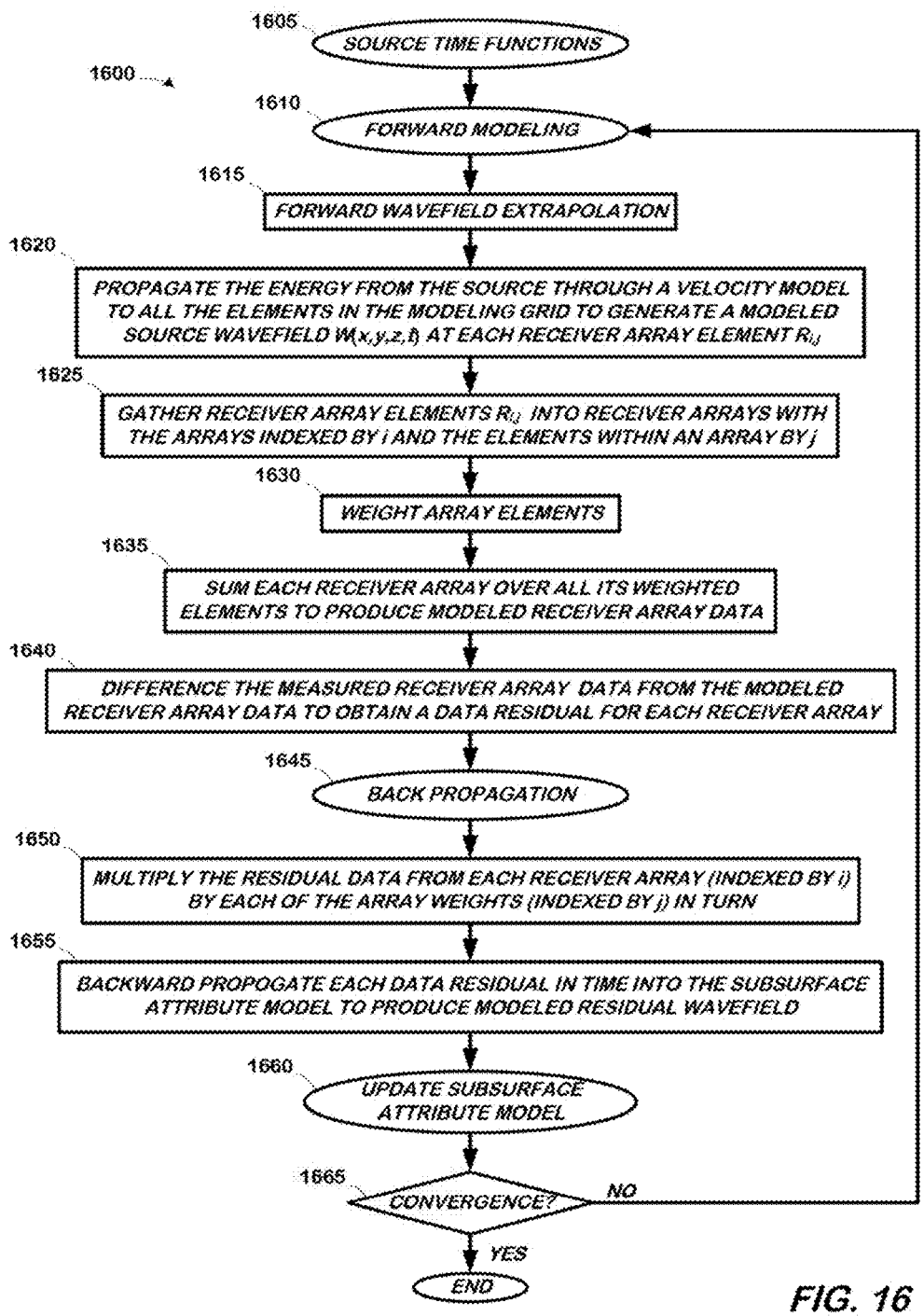
FIG. 16-FIG. 17 graphically illustrates one particular embodiment of a full-waveform inversion technique as may be practiced in some aspects of the presently disclosed technique.
Figure 17:
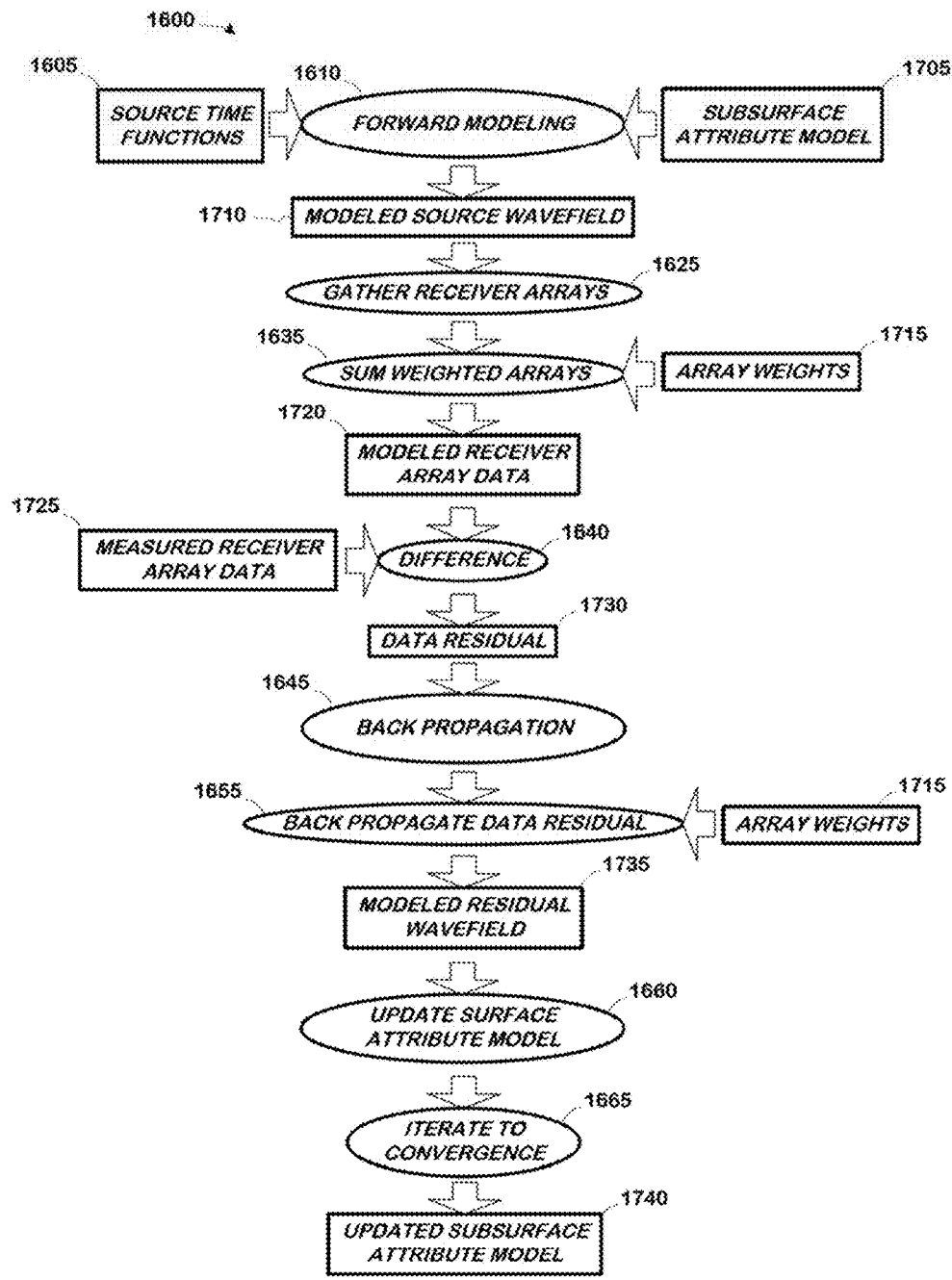

One particular embodiment modifies a FWI technique such as that disclosed in U.S. Pat. No. 7,725,266 to include dip filtering. In this particular embodiment, this is done by including in the model a numerical model of the receiver arrays such as the receiver array 801 in FIG. 8. Referring now to FIG. 16 and FIG. 17, the FWI process 1600 begins (at 1605) with the source time functions S(t) 1605. In the forward-modeling phase (at 1610), during the forward wavefield extrapolation (at 1615), energy from the source (at 1605) is propagated (at 1620) through a subsurface attribute model 1705 to all the elements in the modeling grid. As discussed above and as those in the art having the benefit of this disclosure will appreciate, there are several kinds of subsurface attribute models and any suitable model known to the art may be used. This particular embodiment employs a velocity model.

Performing the forward wavefield extrapolation in this manner produces a modeled source wavefield W(x,y,z,t) 1710 for all time and space and, in particular, a modeled source wavefield W(x,y,z,t) at each receiver array element $R_{i,j}$. The receiver array elements $R_{i,j}$ are gathered (at 1625) into receiver arrays with the arrays indexed by i and the elements within an array by j. In this context, "gather" means to select which receivers are in the array, weighting them by the array weights, and summing. Using a set of array weights $A_{i,j}$ (at 1715), each array of the element is weighted (at 1630).

Each receiver array is then summed over all its weighted elements (at 1635) to produce modeled receiver array data $R_i$ 1720:

$$R_i(t) = \Sigma_j A_{i,j} R_{i,j}(t)$$

The measured receiver array data $D_i$ 1725 from the field are then differenced (at 1640) with the modeled receiver array data 1720 to produce a data residual $E_i$ 1730 for each receiver array.

In the second phase 1645 of back propagation, the FWI process 1600 back-propagates this data residual 1730. It is known in the art how to back propagate a data residual recorded at a point receiver. The principle of reciprocity establishes the correct, consistent way to do this for data from a receiver array: the residual data $E_i(t)$ 1730 from each receiver array (indexed by i) is multiplied (at 1650) by each of the array weights for that array $A_{i,j}(t)$ 1750 (arrays indexed by i, array elements indexed by j) in turn:

$$E_{i,j}(t) = A_{i,j} E_i(t)$$

Each resulting data residual array element $E_{i,j}(t)$ then becomes a source that is backwards-propagated in time (at 1655) into the subsurface attribute model 1705, to produce a modeled residual wavefield 1735 for all time and space.

In the third phase of the algorithm, the modeled source wavefield 1710 and modeled residual wavefield 1735 are used to produce a velocity-model update (at 1660). If the data are not sufficiently well modeled, the updated velocity model becomes a new starting model for another iteration (at 1665). Iterations repeat until convergence (at 1740). This method promotes consistency between the recorded data and the numerical model of the recorded data. Those in the art having the benefit of this disclosure will readily be able to modify known FWI techniques in this manner. More generally, these considerations will apply to any inversion technique that relies on using the mismatch between predicted and recorded seismic data to update an estimated earth model, for example seismic tomography.

The technique also admits variation. In an alternative embodiment, the same work flow in FIG. 16-FIG. 17 is used to constrain what parts of the data the FWI is allowed to fit. In this embodiment the array weights 1715 in the FWI algorithm 1600 are chosen to attenuate arrivals in the data that are not sensitive to the desired geological features of interest. The undesired arrivals are attenuated by their differing dip from the desirable arrivals. In this embodiment the receiver arrays exist only as an embellishment of the FWI algorithm, and do not model a physical receiver array deployed in the field. Not having been attenuated by receiver arrays, the undesired arrivals may be present in the data from the field, but the FWI is constrained from fitting them. Note in this case we give up attempting to maintain consistency between the modeled and recorded data.

Figure 18:
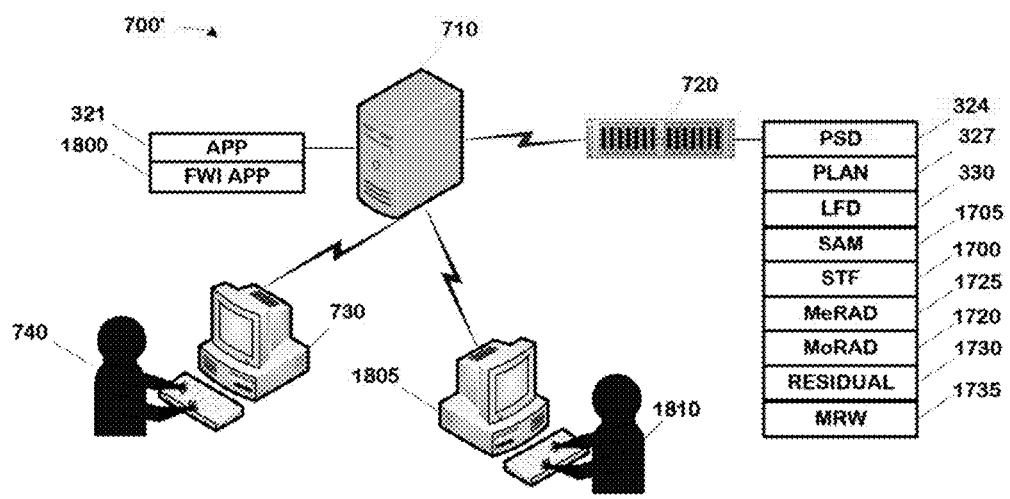
FIG. 18 presents selected hardware and software aspects of one particular embodiment of a computing apparatus such as may be used to implement the full-waveform inversion technique of FIG. 16-FIG. 17.

The FWI process 1600 illustrated in FIG. 16-FIG. 17 is a computer-implemented process. The same general considerations governing computing technology set forth above relative to FIG. 3 also apply to the selection and design of the computing apparatus by which the FWI technique may be implemented. One particular embodiment of such a computing apparatus is shown in FIG. 18. The computing apparatus is the computing apparatus 700 of FIG. 7 modified to also implement the FWI process technique 1600.

More particularly, the computing apparatus 700' in FIG. 18 has been modified relative to the computing apparatus 700 in FIG. 7 to implement the FWI process 1600 described above. The various data, models, etc. used in the process are stored on the mass storage 720 and include the source time functions S(t) 1700, subsurface attribute model 1705, modeled receiver array data 1720, measured receiver array data 1725, data residual 1730, and the modeled residual wavefield 1735. The FWI can be performed by an FWI application 1800 stored on the server 710 and invoked by the user 1810 on a workstation 1805.

Note, however, that the FWI technique admits wide variation in how the computing apparatus may be implemented. There is no requirement that it be on the same computing apparatus as the survey design. Nor is there any reason necessarily that it be located in the same computing facility. Those features are for ease of illustration only. The computing apparatus for the FWI may be completely separate from the computing apparatus for the survey design and geographical proximity is not requisite.

FWI has many uses in the seismic field-generating Earth models, for example. Earth models also have many uses. Ultimately, they are part of a process by which the subterranean formations that they model are analyzed for indications of deposits of hydrocarbons or other fluids. The Earth models produced by the modified FWI technique discussed above can similarly be used to detect such indications.

As is implicit in the discussion of the embodiment of FIG. 2, the presently disclosed technique admits wide variation in the temporal relationship between and amongst various implementations such as that disclosed in FIG. 4. The method 400 of FIG. 4 assumes a linear, somewhat contemporaneous relationship between, for example, the acquisition of the preliminary seismic data (at 410) and the design of the low-frequency, marine survey (at 220). However, many embodiments may exploit the latitude in temporal relationships.

As an example, at sufficiently low frequencies, the standard ocean-bottom-node spacing will be unaliased for the relatively slower-moving surface waves that constitute the bulk of the naturally occurring noise at frequencies below 2 Hz. For example, 2000 m/s at 1 Hz has a Nyquist spacing of 1000 m. This is larger than the standard node spacing of ~450 meters used in conventional ocean-bottom marine surveys. This means that receiver arrays can be formed out of (possibly overlapping) patches of existing nodes in the receiver grid to attenuate the naturally occurring background seismic noise. So, for example the conventional ocean-bottom receiver grid 518 shown in FIG. 6 may be grouped into hexagonal receiver arrays 605 (three shown, only one indicated). If this allows us to extend the usable frequency range of our existing data to sufficiently low frequencies, this alternative processing may allow us to repurpose a conventional acquisition into a "low-frequency" one. In particular, by forming receiver arrays to attenuate noise, we may extend the usable lower-frequency limit of conventional broadband sources such as airguns.

Figure 11:
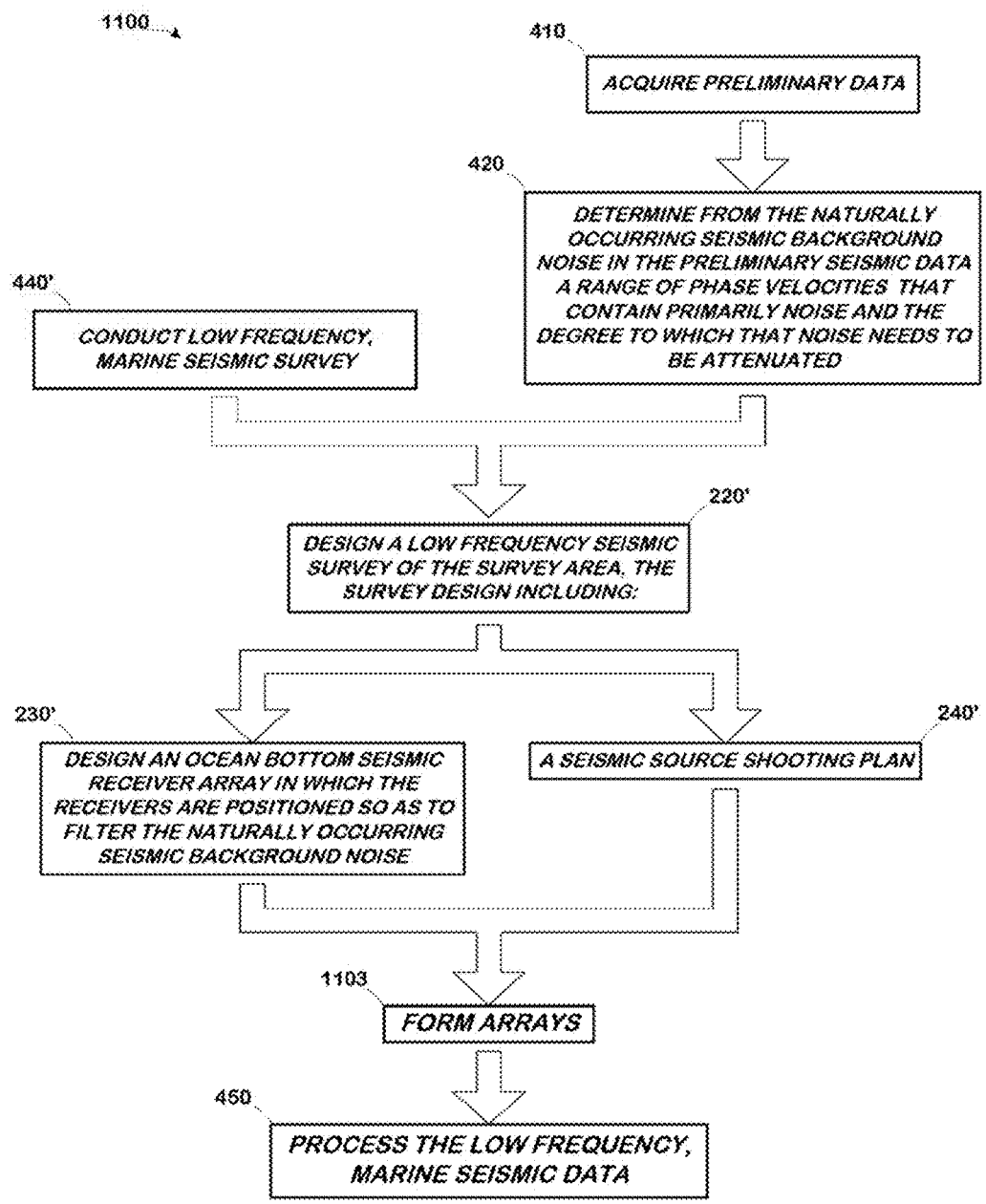
FIG. 11 illustrates another embodiment alternative to that in FIG. 4.

Thus, as shown in FIG. 11, in this embodiment 1100, the design of the low-frequency, marine seismic survey (at 220') may occur after it is conducted (at 440'). The design of the receiver array (at 230') and the seismic source shooting plan (at 240') then comprises selecting how to combine receivers into patches to attenuate ambient noise and/or suppress undesirable data from the active source by including dip filtering in the algorithm. For the latter, sources could also similarly be combined into patches in an exactly analogous way. The receiver and/or source arrays are then constructed and the data weighted and summed accordingly (at 1103) to provide the data that goes into the processing (at 450).

Since the low-frequency, marine seismic survey is conducted (at 440') without regard to the naturally occurring background seismic noise 110, the temporal relationship of the preliminary seismic data acquisition (at 410) is immaterial. It may be acquired prior to, in parallel with, or after the low-frequency, marine seismic survey is conducted (at 440'). However, since it is this data from which the naturally occurring background seismic noise 110 is ascertained (at 420), it should be performed at some point prior to the design of the low-frequency seismic survey (at 220').

In this particular embodiment, since the low-frequency, marine seismic survey has already been conducted (at 440'), the design of the low-frequency, marine survey (at 220') is conducted somewhat differently than it is in the embodiments disclosed above. This occurs primarily in that the receiver acquisition grid and the source sail lines of the already recorded survey constrain the design of the attenuating receiver arrays (at 230') and the seismic source shooting plan (at 240'), respectively. Essentially, the design of the survey (at 220') must make do with what has gone before.

This constraint may manifest itself in several ways. For example, one might arrive at a desired array design and a desired shooting plan, overlay them on what is available from the actually conducted survey, and then accept the congruence between what is desired and what is available as the actual designs. Or one may actually constrain the design process arriving at the desired array design and shooting plan with what is available from the already conducted survey.

One way this might commonly happen is a so-called "piggyback" survey, a low-frequency acquisition that takes advantage of the mobilization and nodes of a conventional acquisition to save costs. A low-frequency source and a conventional source will typically radiate in largely disjoint frequency bands, in which case their signals may be easily separated by bandpass filtering. Or, their signals may be easily separable using standard simultaneous-source separation techniques. Such separation is likely to be particularly successful if the signatures of the two kinds of sources are distinct, for example if the low-frequency source creates energy via sweeping or humming while the conventional airgun source is impulsive.

In either case, the signals from the low-frequency source(s) and conventional source(s) may be separated in data processing. In this case a low-frequency survey and a conventional survey may be performed simultaneously, which saves time and mobilization expense. However, the low-frequency acquisition may then have to make do with a node layout primarily designed for the conventional survey (for example the node layout shown in FIG. 6). The node spacing dictated by the conventional survey may then, for example, influence the choice of frequencies to use for the low-frequency survey. So, for example, a humming acquisition frequency may be chosen such that the receiver node spacing allows receiver arrays that are optimal for ambient noise suppression at that frequency to be formed from patches of nodes. Other examples may become apparent to those skilled in the art having the benefit of this disclosure.

Figure 13A:
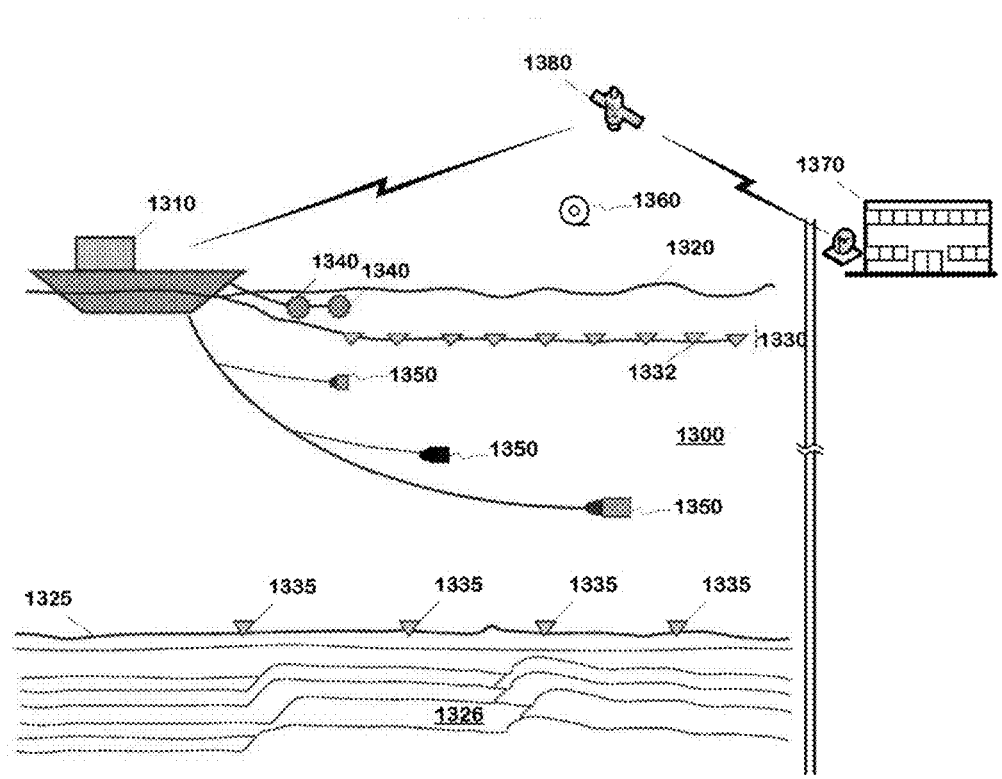
FIG. 13A-FIG. 13B conceptually depicts one particular acquisition that may be used in the embodiment of FIG. 11.

One suitable acquisition for this "piggyback" embodiment is illustrated in FIG. 13A. In some embodiments, a seismic survey will be conducted in the ocean 1300 over a subsurface target of geological interest 1326 which lies beneath the seafloor 1325. A vessel 1310 floating on the ocean surface 1320 will tow a conventional airgun array 1340 and a streamer 1330 of receivers, e.g., hydrophones 1332 (only one indicated). These components comprise the "conventional broadband acquisition" portion of the survey system.

The vessel 1310 may tow one or more low-frequency discrete-frequency "humming" or narrowband sweeping sources 1350, each of which will contain a receiver or sensor (not shown) that will record the wavefield emitted by that source as is often done. To enhance the low-frequency recordings, ocean-bottom receivers 1335 may simultaneously be deployed and used in conjunction with the conventional streamer 1330, or ocean-bottom receivers 1335 may be used without streamers 1330. These comprise the "narrowband, low-frequency" portion of one embodiment of the instant survey system.

In one particular embodiment, the humming or narrowband source is implemented using the source disclosed and claimed in U.S. Pat. No. 8,387,744, incorporated by reference below. However, the technique is not limited to acquisition with this particular source. Alternative embodiments may utilize other sources, for example a tunable bubble resonator source, so long as they are capable of use in acquiring humming and narrowband swept data as described above.

The airguns 1340 may be towed at shallow depths in order to enhance their ability to generate higher-frequency acoustic waves. The low-frequency sources 1350 are shown towed at deeper depths; in some embodiments each will be towed at a depth appropriate for its frequency range, such that the surface ghost reflection maximally enhances the downward-propagating signal. Thus, the deeper the depth of tow, the lower the frequency of the humming or narrowband swept source. See, for example, U.S. application Ser. No. 12/291,221 or U.S. Pat. No. 7,257,049, which discuss the relationship between depth and frequency of acquisition. For some types of sources, the available frequency range shifts upwards with increasing depth, for example because an increase in water pressure raises the resonant frequency of the source. Thus, in other embodiments the lower-frequency sources will be towed at shallower depths, despite the attenuation from the surface ghost reflection that this may cause.

Many variations of this acquisition system are possible and well within the ability of one of ordinary skill in the art to devise. The instant survey system could acquire 2D, 3D, or 4D data. Variations in the design of the spread or the number of vessels will also be readily appreciated by those skilled in the art having the benefit of this disclosure. The low-frequency narrowband survey could be performed at the same time as the conventional, higher-frequency broadband survey, or in a separate pass, or in multiple separate passes. The conventional and low-frequency sources may be towed from the same boat, or more typically different boats.

The low-frequency sources 1350 could operate continuously. The low-frequency sources could each operate at a single frequency or cycle between two or more discrete frequencies ("humming" low-frequency sources), or sweep over a narrowband range of low frequencies designed to augment the frequency range produced by the broadband sources ("narrowband sweeping" low-frequency sources). The sources could operate to produce waves of constant amplitude, or the amplitude of the waves could vary (taper up and down).

The one or more low-frequency humming datasets, one or more narrowband sweeping datasets, and conventional broadband datasets may be acquired in any order. In particular, they may be acquired sequentially, or interleaved by shot lines, or interleaved within a shot line, or acquired simultaneously and separated using any of the standard techniques known in the art, or in any combination of these.

In this particular embodiment, a joint survey is conducted although some embodiments may separate the broadband and low-frequency, narrowband surveys. The conventional survey may proceed in accordance with conventional practice. If the airguns emit waves with a detectable intensity at, for example, 2.8 Hz, the highest of the low-frequency sources, it might be desirable to slightly modify the timing of each shot so that the 2.8 Hz wave component of the airgun signal is timed to be in-phase with the waves produced by the 2.8 Hz low-frequency source(s). Note that at most this would require delaying or advancing the shot timing by 1.4 seconds. Alternatively, the vessel speed could be adjusted so that the airguns reach their shot locations just at the desired point in the humming source's cycling. Note the energy of the acoustic signal produced from airguns rapidly falls off at lower frequencies, so any unwanted interference will be much reduced for any lower low-frequency sources.

The narrowband low-frequency sources may operate independently or simultaneously. The narrowband low-frequency sources may operate continuously or discontinuously. Each narrowband low-frequency source records the signal it is radiating, as this information will be used when performing the full-waveform inversion. The receivers could be recorded continuously. The locations of all sources and receivers will, in some embodiments, also be recorded continuously.

Figure 13B:
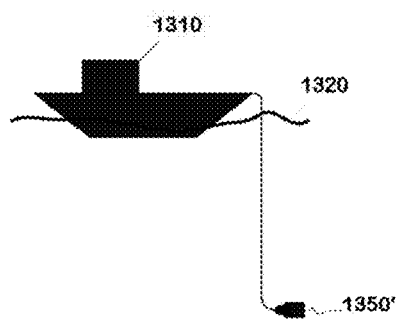

In some alternative embodiments the seismic source is heavy enough to hang nearly vertically underneath the source vessel. One such embodiment is shown, in part, in FIG. 13B. This is referred to, for present purposes, as a "heavy tow". More particularly, the seismic source(s) 1350' is(are) towed at a deep depth and at a steep tow angle. This is because the seismic source 1350', unlike conventional marine seismic sources, is not designed to be neutrally buoyant. It therefore sinks and the tow line and/or umbilical accordingly bears the weight of the seismic source 1350', again unlike conventional practice.

In the illustrated embodiment, the "deep depth" is ~60 m, but this may vary in alternative embodiments from, for example, ~30 m to ~60 m. The tow angle is, for present purposes, the deviation of the tow line from the vertical normal to the mean ocean surface 1320. In the illustrated embodiment, the steep tow angle is ~15° off the vertical, but this may also differ among embodiments.

The heavy tow, if sufficiently close to the vertical, will generate a vortex induced vibration ("VIV"), a phenomenon known to the art. There are known VIV suppression techniques, but these can be overwhelmed if the VIV becomes severe enough. Thus, the precise measure of the steep tow will vary amongst embodiments depending upon, for example, the angle of the tow, the severity of the VIV, and the number and effectiveness of VIV suppression techniques (if any) that are employed. Those in the art having the benefit of this disclosure may discern and appreciate other factors, as well. Thus, a "steep tow" angle is one that is close enough to vertical that VIV starts to become a problem. As noted above, some embodiments may omit the heavy tow.

Although described in terms of marine acquisition, some of the innovative concepts described herein could also apply to land acquisition. In one embodiment of a system for land acquisition, the method may include the following: 1) forming sub-arrays out of a conventional coarse acquisition grid such as in FIG. 6, noting that the sub-arrays become dense at sufficiently low frequencies, and for those low frequencies can thus be used as receiver arrays that attenuate noise by filtering over wave number; 2) optimizing the design of a receiver array over a narrow or monochromatic frequency range, allowing for usable levels of attenuation out of a relatively small grid; 3) augmenting sparse-3D acquisition by replacing conventional receiver lines with "fat receiver lines"; and 4) incorporating dip-filtering into FWI.

The following patent applications, patents, and papers are hereby incorporated by reference for those portions that are listed and for the purposes set forth as if set forth verbatim herein.

U.S. application entitled, "Seismic Acquisition at Low Frequencies with Deeply Towed, Heavy Seismic Sources", having priority to U.S. Provisional Application No. 62/086,581 and with the inventors Andrew J. Brenders et al.

U.S. Application Ser. No. 61/896,394, entitled "Two Stage Seismic Velocity Model", and filed Oct. 28, 2013, in the name of the inventors Andrew Brenders and Joseph Dellinger, for its teachings regarding humming acquisition and FWI with data collected through humming acquisition.

U.S. application Ser. No. 13/327,524, entitled, "Seismic Acquisition Using Narrowband Seismic Sources", filed Dec. 15, 2011, in the name of the inventors Joseph A. Dellinger et al., published Jun. 21, 2012, as U.S. Patent Publication 2012/0155217, and commonly assigned herewith for its teachings regarding data acquisition, and in particular, frequency humming sweeps located at ¶¶[0024]-[0040], [0054]-[0059], [0065]-[0088].

U.S. Pat. No. 7,725,266, entitled, "System and Method for 3D Frequency Domain Waveform Inversion Based on 3D Time-Domain Forward Modeling", and issued May 25, 2010, to BP Corporation North America Inc., as assignee of the inventors Laurent Sirgue et al., for its teaching regarding the full-waveform inversion technique at column 7, line 64 to column 13, line 50, with reference to FIGS. 3-5 therein.

U.S. Pat. No. 8,387,744, entitled, "Marine Seismic Source", and issued Mar. 5, 2013, to BP Corporation North America Inc., as assignee of the inventors Mark Harper et al., for its teaching regarding the design and operation of a humming and narrowband seismic source at column 5, line 62 to col. 12, lines 46.

*Carbonate Seismology*, Vol. 6 (Palaz, et al. eds. SEG Books 1997). The chapter is authored by Carl Regone and entitled "Measurement and Identification of 3-D Coherent Noise Generated from Irregular Surface Carbonate". This paper is incorporated for its teachings regarding box wave analysis of seismic waves.

To the extent that any patent, patent application or paper incorporated by reference herein conflicts with the present disclosure, the present disclosure controls.

Where reference is made herein to a method comprising two or more defined steps, the defined steps can be carried out in any order or simultaneously (except where context excludes that possibility), and the method can also include one or more other steps which are carried out before any of the defined steps, between two of the defined steps, or after all of the defined steps (except where context excludes that possibility).

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for use in marine seismic acquisition, comprising:
   deploying a receiver array oriented in a first direction, wherein the receiver array comprises a plurality of sparsely spaced receiver lines oriented in the first direction, and wherein each of the receiver lines comprises a plurality of densely positioned lines of receiver nodes;
   shooting a plurality of seismic signals from a plurality of seismic sources along a plurality of sparsely positioned sail lines, wherein each of the sail lines are oriented in a second direction orthogonal to the first direction; and
   recording returned energy of the seismic signals.

2. The method of claim 1, wherein deploying the sparse receiver array includes deploying nodes of seismic receivers that are spaced about 4 kilometers (km) apart.

3. The method of claim 1, wherein shooting the plurality of seismic signals includes shooting the seismic signals from positions spaced about 150 meters (m) apart along the sail lines.

4. The method of claim 1, wherein the sail lines are spaced about 1 kilometers (km) apart.

5. The method of claim 1, wherein shooting the plurality of seismic signals includes shooting a plurality of frequency humming seismic signals.

6. The method of claim 1, wherein the seismic signals are low frequency seismic signals.

* * * * *